(12) United States Patent
Imaizumi

(10) Patent No.: US 8,914,249 B2
(45) Date of Patent: Dec. 16, 2014

(54) RESISTANCE MEASURING APPARATUS

(75) Inventor: Satoshi Imaizumi, Ueda (JP)

(73) Assignee: Hioki Denki Kabushiki Kaisha, Nagano (JP)

( * ) Notice: Subject to any disclaimer, the term of this patent is extended or adjusted under 35 U.S.C. 154(b) by 1024 days.

(21) Appl. No.: 12/485,975

(22) Filed: Jun. 17, 2009

(65) Prior Publication Data

US 2009/0322358 A1    Dec. 31, 2009

(30) Foreign Application Priority Data

| | | |
|---|---|---|
| Jun. 30, 2008 | (JP) | 2008-170042 |
| Jul. 15, 2008 | (JP) | 2008-183316 |
| Aug. 6, 2008 | (JP) | 2008-202631 |
| Oct. 29, 2008 | (JP) | 2008-277617 |
| Feb. 18, 2009 | (JP) | 2009-035022 |
| Feb. 27, 2009 | (JP) | 2009-045836 |
| Mar. 3, 2009 | (JP) | 2009-048833 |

(51) Int. Cl.
G01R 15/00 (2006.01)
G01R 27/02 (2006.01)
G01R 27/20 (2006.01)

(52) U.S. Cl.
CPC ............. *G01R 27/02* (2013.01); *G01R 27/20* (2013.01)
USPC .............................. 702/64; 324/713; 324/715

(58) Field of Classification Search
CPC .... G01R 15/183; G01R 15/186; H01F 27/02; H01F 27/022; H01F 38/26; H01F 38/34; H01F 38/36; H01F 41/125; H01F 41/127; H01F 2041/02
USPC ..................................... 702/35, 184
See application file for complete search history.

(56) References Cited

U.S. PATENT DOCUMENTS

| | | | | |
|---|---|---|---|---|
| 3,711,807 A | * | 1/1973 | Yamashita et al. | 336/205 |
| 4,032,832 A | * | 6/1977 | Miller | 363/43 |

(Continued)

FOREIGN PATENT DOCUMENTS

| | | |
|---|---|---|
| JP | 53-096428 | 8/1978 |
| JP | 55-90862 | 7/1980 |

(Continued)

OTHER PUBLICATIONS

English language Abstract of JP 55-90862, Jul. 9, 1980.

(Continued)

*Primary Examiner* — Janet Suglo
*Assistant Examiner* — Michael Dalbo
(74) *Attorney, Agent, or Firm* — Greenblum & Bernstein, P.L.C.

(57) ABSTRACT

A resistance measuring apparatus includes: a voltage injector that injects an AC signal into a circuit by applying an AC voltage to an injection coil; a current measuring unit that measures an AC current produced in the circuit by the injection coil using a detection coil; a processing unit that calculates the circuit resistance from the AC signal voltage and the measured AC current; and a reference signal generator that outputs a binary reference signal that has a same period as the AC voltage and is synchronized to the clock. The voltage injector generates a stepped wave whose amplitude changes in synchronization with a clock, applies a signal based thereon as the AC voltage. The current measuring unit converts the current in the detection coil to a voltage signal, carries out synchronous detection using the reference signal, and measures the AC current based on the synchronous detection result.

2 Claims, 18 Drawing Sheets

(56) References Cited

U.S. PATENT DOCUMENTS

| | | | |
|---|---|---|---|
| 4,209,741 A * | 6/1980 | Coby et al. | 324/713 |
| 5,307,064 A * | 4/1994 | Kudoh | 341/144 |
| 5,473,244 A * | 12/1995 | Libove et al. | 324/126 |
| 5,659,251 A | 8/1997 | Wakamatsu | 324/445 |
| 6,191,673 B1 * | 2/2001 | Ogura et al. | 336/84 R |
| 6,239,682 B1 * | 5/2001 | McCloskey | 336/90 |
| 6,255,864 B1 * | 7/2001 | Culca | 327/78 |
| 6,501,259 B1 * | 12/2002 | Cheng | 324/76.53 |
| 7,557,563 B2 * | 7/2009 | Gunn et al. | 324/127 |
| 2003/0107007 A1 * | 6/2003 | Heike et al. | 250/492.2 |
| 2003/0141925 A1 * | 7/2003 | Lennous | 327/553 |
| 2004/0138836 A1 * | 7/2004 | Ishishita et al. | 702/63 |
| 2005/0017726 A1 * | 1/2005 | Koran et al. | 324/433 |
| 2005/0151567 A1 * | 7/2005 | Shimada et al. | 327/78 |
| 2005/0250459 A1 * | 11/2005 | Tervaluoto et al. | 455/127.2 |
| 2006/0123908 A1 * | 6/2006 | Ito | 73/514.32 |
| 2007/0058402 A1 * | 3/2007 | Shekhawat et al. | 363/89 |
| 2007/0164723 A1 | 7/2007 | Yanagisawa | |
| 2007/0273391 A1 * | 11/2007 | Corry | 324/649 |
| 2008/0129284 A1 * | 6/2008 | Hu et al. | 324/207.2 |
| 2008/0298107 A1 * | 12/2008 | Lin | 363/131 |

FOREIGN PATENT DOCUMENTS

| | | |
|---|---|---|
| JP | 56-142376 | 10/1981 |
| JP | 2-7031 | 2/1990 |
| JP | 5-99961 | 4/1993 |
| JP | 8-15341 | 1/1996 |
| JP | 2005-216984 | 8/2005 |
| JP | 2007-57340 | 3/2007 |

OTHER PUBLICATIONS

Japan (JP Appl. No. 2008-277617) Office action, mail date is Jan. 29, 2013.

* cited by examiner

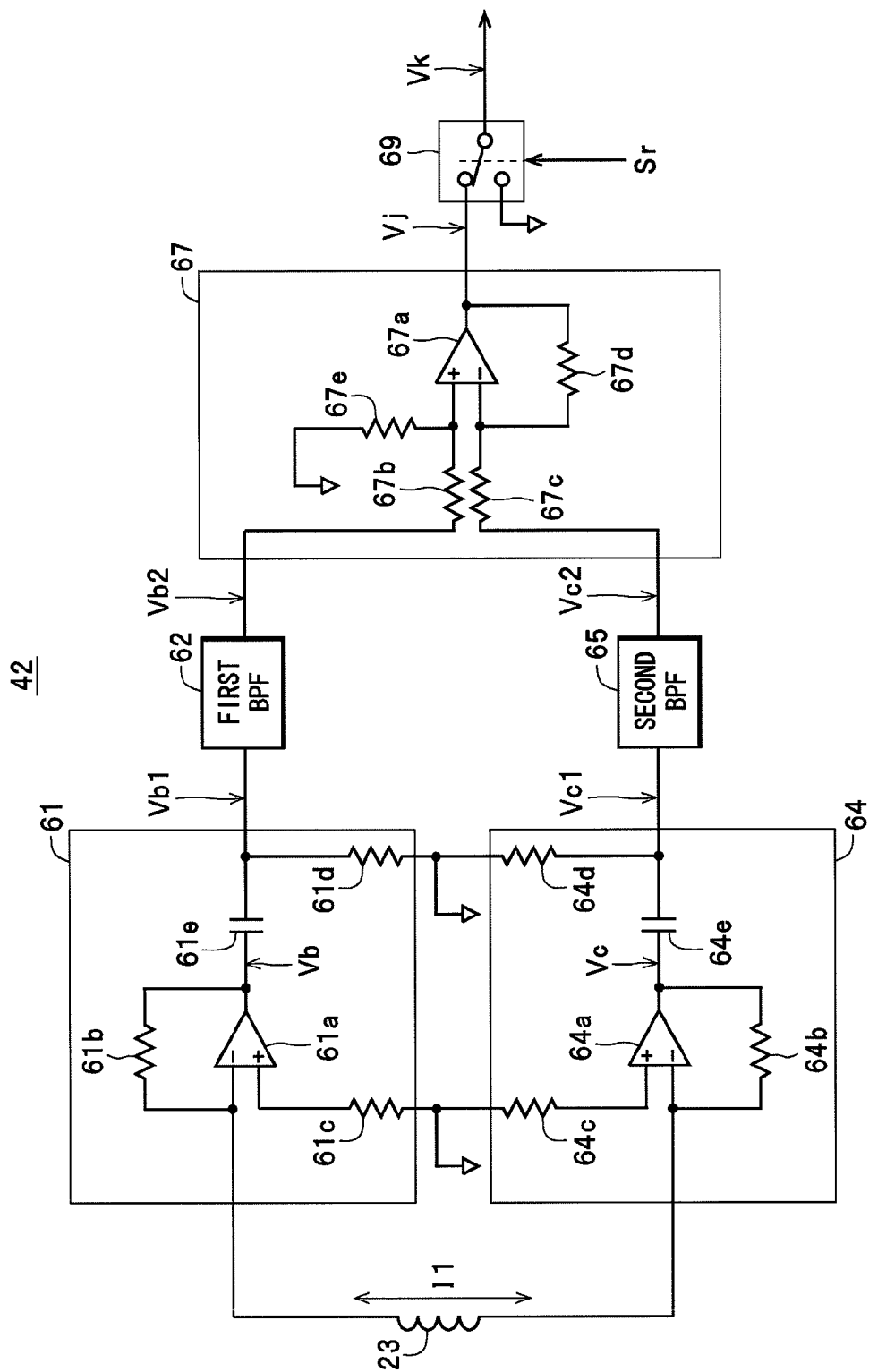
F I G. 1 9

F I G. 2 5
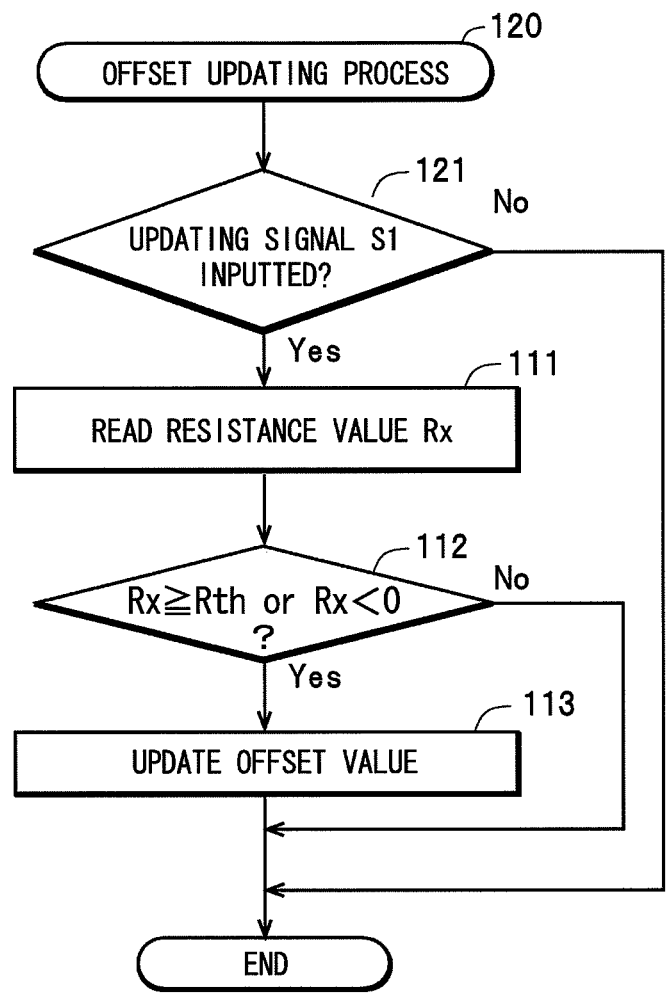

RESISTANCE MEASURING APPARATUS

BACKGROUND OF THE INVENTION

1. Field of the Invention

The present invention relates to a resistance measuring apparatus that measures the resistance of a circuit to be measured.

2. Description of the Related Art

As one example of this type of resistance measuring apparatus, the resistance measuring apparatus disclosed in Japanese Examined Patent Application Publication No. H02-7031 (see Paragraphs 1 to 4 and FIG. 2) is known. This resistance measuring apparatus includes an injection transformer that is clipped onto a connecting lead of a measured network and injects a current of a second frequency, which can be discriminated from a current of a first frequency that flows in the measured network ("measured object"), into the measured network, a detection transformer ("detection coil") that is clipped onto the connecting lead and detects the above two types of current flowing in the measured network, a frequency selecting circuit (more specifically, a frequency-selecting amplification circuit) that extracts the second frequency component out of the output of the detection transformer, a rectifying amplification circuit that rectifies and amplifies a signal (voltage) outputted from the frequency selecting circuit (frequency-selecting amplification circuit), and display means (more specifically, an indicator) that is driven by the signal (voltage) outputted from the rectifying amplification circuit and displays the output of the rectifying amplification circuit. In addition, the injection transformer is equipped with a feedback loop that includes an injection coil, which is supplied with an output voltage of an oscillator and injects the current with the second frequency into the measured network, and a feedback coil and is capable of changing the voltage supplied to the injection coil so as to make the voltage induced in the feedback coil constant. In this resistance measuring apparatus, since control is also carried out to make constant the injection voltage obtained by dividing the voltage induced in the feedback coil by the ratio of the number of windings in the feedback coil to the number of connecting leads (the number of leads clipped onto, which is one in this example) of the measured network, by detecting a voltage generated across a resistor connected to the detection transformer due to the current flowing in the detection transformer, it is possible to measure the resistance value of a resistance element (i.e., a resistance to be measured) connected to the measured network based on the resistance value of the resistor connected to the detection transformer, the voltage generated across such resistor, the voltage generated across the feedback coil, the number of windings in the injection transformer (injection coil), and the number of windings in the detection transformer (detection coil).

SUMMARY OF THE INVENTION

However, by investigating the resistance measuring apparatus described above, the present inventor found the problem described below with the resistance measuring apparatus. Firstly, in the frequency selecting circuit of the above resistance measuring apparatus, the second frequency component is extracted by removing unnecessary frequency components from the output of the detection transformer. In this case, although it is necessary to construct the frequency selecting circuit using a band-pass filter with a steep slope (i.e., a high Q band-pass filter) to extract the second frequency component with high precision, it will be necessary to use high-precision components to realize such a frequency selecting circuit, and since such high-precision components are normally expensive, there is the problem of a rise in the manufacturing cost. Also, although the center frequency of a band-pass filter will unavoidably shift due to the influence of peripheral temperature, with a high Q band-pass filter, a shift in the center frequency has an extremely large effect, and therefore there is the risk that the shift in center frequency will cause a large fall in precision.

Secondly, with this resistance measuring apparatus, since the injection coil and the detection coil are clipped onto the measured network by carrying out separate operations, it is always necessary to carry out two clipping operations, resulting in the problem that measurement operations are troublesome. There is a further problem in that since there are fluctuations in the clipped-on positions of both coils onto the measured network, the relative positions of both coils are not stable and the conditions during measuring become unstable. To solve such problems, the present inventor has already developed a new resistance measuring apparatus that can make the clipping operation more efficient and can stabilize the relative positions of the coils by adapting the resistance measuring apparatus described above to a construction where the injection coil and the detection coil are enclosed in a single clamp-type housing.

However, with a construction where both coils are enclosed in a single clamp-type housing, since the injection coil and the detection coil are adjacent, a phenomenon occurs whereby the magnetic field generated in the injection coil directly encircles the detection coil. With the conventional resistance measuring apparatus described above, although the frequency selecting circuit removes unnecessary frequency components from the output of the detection transformer (detection coil) and extracts the second frequency component, since the frequency component generated in the detection coil due to the detection coil being encircled by the magnetic field generated by the injection coil is the same frequency component injected by the injection coil (i.e., the second frequency component), it is not possible to remove such component using the frequency selecting circuit, resulting in the problem that it is difficult to achieve a suitable measurement precision.

Thirdly, in the above resistance measuring apparatus, the rectifying amplification circuit that generates the signal supplied to the indicator is normally constructed of a DC amplification circuit and the signal outputted from the frequency selecting amplification circuit (a signal that includes a DC component in proportion to the resistance value of the measured network) is DC amplified and supplied to the indicator. However, in a construction that uses DC amplification, there is the problem of deterioration in the dynamic reserve and a reduction in noise tolerance. Also, although it is necessary to use an amplifier with a small offset as the operational amplifier that constructs the rectifying amplification circuit, since such operational amplifiers are expensive, there is also the problem that this brings about a rise in the manufacturing cost.

Fourthly, in the resistance measuring apparatus described above, since the detection coil formed in the detection transformer is constructed so as to be grounded at one end (i.e., so as to be "single-ended"), the resistance measuring apparatus is susceptible to the effects of an induced current that flows to ground due to induction from the periphery. To reduce such effects, it is necessary to provide the detection transformer with a shield and to ground the shield. However, there is the problem that connecting a shield to ground in this way is disadvantageous for safety standards (as one example, International Safety Standard IEC 61010)

Fifthly, in the resistance measuring apparatus described above, the second frequency component out of the frequency components included in the output of the detection transformer is selectively amplified using a frequency selecting circuit (more specifically, a frequency-selecting amplifying circuit). In this case, an offset is typically produced in an amplification circuit such as a frequency selecting circuit, and such offset causes measurement errors in the resistance measuring apparatus. For this reason, the amplification circuit is normally constructed so as to include a circuit for adjusting the offset and adjustment is carried out during an adjustment step carried out before the resistance measuring apparatus is shipped to make the offset zero (adjustment that cancels the offset). However, in a resistance measuring apparatus, even if the amplification circuit is adjusted to realize a state where there is no offset, an offset may still be produced in the amplification circuit due to changes in environmental conditions such as temperature and humidity and/or changes over time in the characteristics of the electronic components that construct the amplification circuit, resulting in the problem of measurement errors being generated by the offset. The present applicant has also developed a resistance measuring apparatus with a function for automatically canceling the offset every time the power is turned on (i.e., once every time the power is turned on), but there is still the problem that it is not possible to cancel an offset that is produced due to changes in environmental conditions during use and/or changes over time in the electronic components.

The present invention was conceived to solve the first problem described above and it is a first object to provide a resistance measuring apparatus that can measure resistance with high precision while avoiding the use of a high Q band-pass filter.

The present invention was also conceived to solve the second problem described above and it is a second object to provide a resistance measuring apparatus that can facilitate clipping operations of the injection coil and the detection coil and achieve favorable measurement precision while stabilizing the relative positions of the coils.

The present invention was also conceived to solve the third problem described above and it is a third object to provide a resistance measuring apparatus that can avoid deterioration in the dynamic reserve and increases in apparatus cost.

The present invention was also conceived to solve the fourth problem described above and it is a fourth object to provide a resistance measuring apparatus that can reduce the effects of noise.

The present invention was also conceived to solve the fifth problem described above and it is a fifth object to provide a resistance measuring apparatus that can reduce the effects of an offset.

To achieve the stated first object, a first resistance measuring apparatus according to the present invention includes: a voltage injecting unit that injects a testing AC signal into a measured circuit by applying an AC voltage to an injection coil; a current measuring unit that detects and measures an AC current, which is flowing in the measured circuit due to injection of the testing AC signal, using a detection coil; and a processing unit that calculates a resistance value of the measured circuit based on a voltage value of the injected testing AC signal and a measured value of the AC current, wherein the voltage injecting unit generates a stepped wave whose amplitude changes in synchronization with a reference clock and applies a signal based on the stepped wave as the AC voltage, the resistance measuring apparatus further includes a reference signal generating unit that synchronizes a binary signal with a same period as the AC voltage to the reference clock and outputs the binary signal as a reference signal, and the current measuring unit converts a current flowing in the detection coil due to the injection of the testing AC signal to a voltage signal, carries out synchronous detection on the voltage signal using the reference signal, and measures a current value of the AC current based on a signal obtained by the synchronous detection.

In the first resistance measuring apparatus, the voltage injecting unit generates the stepped wave whose amplitude changes in synchronization with the reference clock and applies the signal based on the stepped wave to the injection coil as the AC voltage. By doing so, the testing AC signal is injected into the measured circuit. On the other hand, a reference signal generating unit synchronizes the binary signal that has the same period as the AC voltage with the reference clock and outputs the result as the reference signal. The current measuring unit converts the current flowing in the detection coil due to the injection of the testing AC signal to the voltage signal, carries out synchronous detection on the voltage signal using the reference signal, and measures the current value of the AC current flowing in the measured circuit based on the signal obtained by the synchronous detection.

Therefore, according to the first resistance measuring apparatus, even if the phase of the AC voltage applied to the injection coil has changed with respect to the reference clock due to changes in temperature and/or humidity, provided that the change in phase is within one cycle of the reference clock, it will be possible to forcibly synchronize rises and falls in the reference signal with rises (or falls) in the reference clock. As a result, it will be possible to greatly reduce any shift in phase between the reference signal and the reference clock due to changes in temperature and/or humidity, that is, it will be possible to greatly reduce fluctuations in the duty ratio of the reference signal. Therefore, according to the first resistance measuring apparatus, by using the reference signal, it is possible to carry out synchronous detection precisely on the voltage signal produced by converting the current flowing in the detection coil to a voltage. This means it is possible to measure the current value of the AC current flowing in the measured circuit with high precision based on the signal obtained by the synchronous detection, while avoiding the use of a high Q band pass filter, and by doing so, it is possible to sufficiently improve the measurement precision of the resistance value of the measured circuit.

Also, in the first resistance measuring apparatus, the voltage injecting unit may carry out a filtering process on the stepped wave and apply a signal generated by subjecting the stepped wave to the filtering process to the injection coil as the AC voltage. With this construction, it is possible to apply the signal to the injection coil in a state where frequency components aside from the fundamental frequency component of the stepped wave have been attenuated.

Also, in the first resistance measuring apparatus, the reference signal generating unit may include a flip-flop that synchronizes the binary signal to the reference clock and outputs the synchronized binary signal as the reference signal. With this construction, it is possible to reliably synchronize the binary signal to the reference clock and output the binary signal as the reference signal.

In the first resistance measuring apparatus, the reference signal generating unit may include a comparator that generates the binary signal based on the AC voltage. With this construction, it is possible to reliably generate the binary signal from the AC voltage with a simple construction.

Also, in the first resistance measuring apparatus, the comparator may be constructed of a comparator that exhibits hysteresis. With this construction, it is possible to reduce the effects of noise and further improve the measurement accuracy of the resistance value of the measured circuit.

Also, in the first resistance measuring apparatus, the voltage injecting unit may include a class D amplifier that amplifies the signal based on the stepped wave to generate the AC voltage. With this construction, it is possible to generate the amplified AC voltage with low loss, and as a result, it is possible to sufficiently improve the efficiency of the apparatus. Also, when the power amplifier unit is constructed of a Class D amplifier, a large amount of high-frequency noise will be included inside the AC voltage. However, since the AC voltage amplified by the power amplifier unit and the reference signal for synchronous detection are both generated in synchronization with the reference clock, by using the reference signal, it is possible to carry out synchronous detection correctly on a voltage signal produced by converting the current flowing in the detection coil due to injection of the testing AC signal to a voltage, and as a result, it is possible to increase the noise tolerance.

In the first resistance measuring apparatus, the voltage injecting unit may include: a counter that changes a count value in synchronization with the reference clock between a start value and an end value that are set in advance; and a D/A conversion circuit that generates the stepped wave based on the count value. With this construction, it is possible to reliably generate the desired stepped wave using a simple circuit construction.

In the first resistance measuring apparatus, the D/A conversion circuit may be constructed of a resistance ladder circuit. With this construction, it is possible to construct the D/A conversion circuit at low cost.

To achieve the stated second object, a second resistance measuring apparatus according to the present invention includes: a voltage injecting unit that injects a testing AC signal into a measured circuit by applying an AC voltage to an injection coil; a current measuring unit that detects and measures an AC current, which is flowing in the measured circuit due to injection of the testing AC signal, using a detection coil; a processing unit that calculates a resistance value of the measured circuit based on a voltage value of the injected testing AC signal and a measured value of the AC current; and a single clamp-type housing that houses the injection coil and the detection coil, wherein the voltage injecting unit applies a signal that is synchronized to a reference signal as the AC voltage, and the current measuring unit converts a current flowing in the detection coil due to the injection of the testing AC signal to a voltage signal, carries out synchronous detection on the voltage signal using the reference signal, and measures a current value of the AC current based on a signal obtained by the synchronous detection.

According to the second resistance measuring apparatus, since the injection coil and the detection coil are enclosed in a single clamp-type housing, it is possible to clip the injection coil and the detection coil onto the measured circuit in a single clamping operation, which makes it easier to measure resistance using the resistance measuring apparatus. Also, since the relative positions of the coils can be stabilized (i.e., kept constant), when the resistance is repeatedly measured for the same measured circuit, it is possible to stabilize the measurement results (i.e., to improve the precision of repeated measurement). Since the current measuring unit converts the current flowing in the detection coil due to the injection of the testing AC signal to a voltage signal, carries out synchronous detection on the voltage signal using the reference signal, and measures a current value of the AC current based on a signal obtained by the synchronous detection, magnetic flux from the injection coil will directly leak into the detection coil due to the injection coil and the detection coil being enclosed in a single housing. However, by carrying out synchronous detection using the reference signal, it is possible to completely remove the component generated in the AC current due to such leaking magnetic flux, and to measure the current value of the detection current and in turn the resistance value of the measured circuit with sufficient precision.

In the second resistance measuring apparatus, the voltage injecting unit may include a class D amplifier that amplifies the signal that is synchronized to the reference signal to generate the AC voltage. With this construction, it is possible to generate the AC voltage with low loss, and as a result, it is possible to sufficiently improve the efficiency of the apparatus. Accordingly, even with the same power consumption, it is possible to efficiently generate the AC voltage and therefore possible to reduce the inductance of the injection coil. This means it is possible to reduce the thickness of the injection coil, and as a result, it is possible to make the housing thinner. When the voltage injecting unit is constructed of a Class D amplifier, a large amount of high-frequency noise will be included in the AC voltage. However, since such high-frequency noise can be removed by synchronous detection, it is possible to increase the noise tolerance.

Also, in the second resistance measuring apparatus, the injection coil and the detection coil may be enclosed in the housing so as to be stacked in a thickness direction thereof. With this construction, it is possible to reduce the difference between the inner diameter and the outer diameter of the housing and to clip onto a thicker measured circuit even when the housing has the same outer diameter. This means that resistance can be measured for a wider range of measured circuits.

Also, in the second resistance measuring apparatus, the injection coil and the detection coil may be formed with respectively different diameters, one coil out of the injection coil and the detection coil with a smaller diameter may be positioned inside another coil out of the injection coil and the detection coil, and the injection coil and the detection coil may be enclosed inside the housing so as to be disposed on a same plane. With the above construction, compared to a construction where the injection coil and the detection coil are stacked in the thickness direction, it is possible to reduce the thickness of the housing.

To achieve the stated third object, a third resistance measuring apparatus according to the present invention includes: a voltage injecting unit that injects a testing AC signal into a measured circuit by applying an AC voltage to an injection coil; a current measuring unit that detects and measures an AC current, which is flowing in the measured circuit due to injection of the testing AC signal, using a detection coil; and a processing unit that calculates a resistance value of the measured circuit based on a voltage value of the injected testing AC signal and a measured value of the AC current, wherein the voltage injecting unit intermittently applies the AC voltage, the resistance measuring apparatus further comprises a reference signal generating unit that generates a binary signal in synchronization with the applied AC voltage and outputs the binary signal as a reference signal, and the current measuring unit includes: a current-to-voltage converting circuit that converts a current flowing in the detection coil due to the injection of the testing AC signal to a voltage signal; a synchronous detection circuit that carries out synchronous detection on the voltage signal using the reference signal; a DC removal circuit that integrates a detection output signal outputted from the synchronous detection circuit, removes a DC component, and outputs an AC component; and an AC amplifier circuit that amplifies the AC component, wherein the current measuring unit measures the current value of the AC current.

In the third resistance measuring apparatus, the voltage injecting unit causes the testing AC signal to be generated in the measured circuit by intermittently applying the AC voltage to the injection coil. The reference signal generating unit generates the binary signal that is synchronized to the applied AC voltage and outputs the result as the reference signal. Also, in the current measuring unit, the current-to-voltage converting circuit converts the current flowing in the detection coil due to the injection of the testing AC signal to a voltage signal, the synchronous detection circuit carries out synchronous detection on the voltage signal using the reference signal, the DC removal circuit removes the DC component included in the detection output signal outputted from the synchronous detection circuit and outputs the AC component; and the AC amplifier circuit amplifies and outputs the AC component.

Therefore, according to the third resistance measuring apparatus, by AC amplifying the voltage signal that is required when measuring the detection current flowing in the measured circuit as an AC signal using the AC amplifier unit, unlike a construction that uses DC amplification, it is possible to avoid deterioration in the dynamic reserve and also a reduction in the noise tolerance. In addition, since it is not necessary to use a costly operational amplifier with a small offset, such as a DC amplifier, when constructing the AC amplifier unit, it is possible to avoid increases in the cost of the current measuring unit and in turn of the resistance measuring apparatus.

Also, in the third resistance measuring apparatus, the reference signal generating unit may include a comparator that generates the binary signal based on the applied AC voltage. With this construction, it is possible to reliably generate the binary signal from the AC voltage with a simple construction.

To achieve the stated fourth object, a fourth resistance measuring apparatus according to the present invention includes: a voltage injecting unit that injects a testing AC signal into a measured circuit; a current measuring unit that detects and measures an AC current, which is flowing in the measured circuit due to injection of the testing AC signal, using a detection coil; and a processing unit that calculates a resistance value of the measured circuit based on the injected testing AC signal and the measured AC current, wherein the voltage injecting unit generates the testing AC signal in synchronization with a reference signal, the current measuring unit includes: a first amplifier unit that includes at least a first operational amplifier with an inverted input terminal connected to one end of the detection coil and a non-inverted input terminal into which a reference voltage is inputted, converts a current flowing in the detection coil to a first voltage signal, and outputs the first voltage signal; a second amplifier unit that includes at least a second operational amplifier with an inverted input terminal connected to another end of the detection coil and a non-inverted input terminal into which the reference voltage is inputted, converts a current flowing in the detection coil to a second voltage signal with opposite phase to the first voltage signal, and outputs the second voltage signal; a first extraction unit that carries out synchronous detection on the first voltage signal and the second voltage signal in synchronization with the reference signal to extract a positive polarity signal composed of only positive side parts of waveforms of the first voltage signal and the second voltage signal; a second extraction unit that carries out synchronous detection on the first voltage signal and the second voltage signal in synchronization with the reference signal to extract a negative polarity signal composed of only negative side parts of waveforms of the first voltage signal and the second voltage signal; and a third amplifier unit that outputs a difference signal on a difference between the positive polarity signal and the negative polarity signal, and the processing unit calculates a current value based on a voltage value of the testing AC signal and the difference signal and calculates a resistance value of the measured circuit based on the voltage value and the current value.

According to the fourth resistance measuring apparatus, since it is possible to avoid the use of a single-ended detection coil and the use of a shunt resistor, it is possible to achieve favorable frequency characteristics while maintaining a sufficient detection gain. Also, since the fourth resistance measuring apparatus is constructed so that the first amplifier unit and the second amplifier unit that are connected to the respective ends of the detection coil output the first voltage signal and the second voltage signal with respectively opposite phase based on the current flowing in the detection coil, and the third amplifier unit outputs the difference signal on a difference between the positive polarity signal and the negative polarity signal generated by the extraction units based on such signals, even if common-mode noise is superimposed on the current flowing in the detection coil, it will still be possible to cancel the common-mode noise in the third amplifier unit. Also, since the extraction units carry out synchronous detection on the first and second voltage signals in synchronization with the reference signal and extract the positive polarity signal and the negative polarity signal, even if normal-mode noise is included in the current in the detection coil, it will still be possible to remove such normal-mode noise.

Another fourth resistance measuring apparatus according to the present invention includes: a voltage injecting unit that injects a testing AC signal into a measured circuit; a current measuring unit that detects and measures an AC current, which is flowing in the measured circuit due to injection of the testing AC signal, using a detection coil; and a processing unit that calculates a resistance value of the measured circuit based on the injected testing AC signal and the measured AC current, wherein the voltage injecting unit generates the testing AC signal in synchronization with a reference signal, the current measuring unit includes: a first amplifier unit that includes at least a first operational amplifier with an inverted input terminal connected to one end of the detection coil and a non-inverted input terminal into which a reference voltage is inputted, converts a current flowing in the detection coil to a first voltage signal, and outputs the first voltage signal; a second amplifier unit that includes at least a second operational amplifier with an inverted input terminal connected to another end of the detection coil and a non-inverted input terminal into which the reference voltage is inputted, converts a current flowing in the detection coil to a second voltage signal with opposite phase to the first voltage signal, and outputs the second voltage signal; a third amplifier unit that outputs a difference signal on a difference between the first voltage signal and the second voltage signal; and an extraction unit that carries out synchronous detection on the difference signal in synchronization with the reference signal to extract a single polarity signal composed of one of a positive-side part and a negative-side part of a waveform of the difference signal, and the processing unit calculates a current value based on a voltage value of the testing AC signal and the single polarity signal and calculates a resistance value of the measured circuit based on the voltage value and the current value.

According to the other fourth resistance measuring apparatus, since it is possible to avoid the use of a single-ended detection coil and the use of a shunt resistor, it is possible to achieve favorable frequency characteristics while maintaining a sufficient detection gain. Also, since the other fourth resistance measuring apparatus is constructed so that the first amplifier unit and the second amplifier unit that are connected to the respective ends of the detection coil output the first voltage signal and the second voltage signal with respectively opposite phase based on the current flowing in the detection coil, and the third amplifier unit outputs the difference between such signals as the difference signal, even if common-mode noise is superimposed on the current flowing in the detection coil, it will still be possible to cancel the common-mode noise in the third amplifier unit. Also, since the extraction unit carries out synchronous detection on the difference signal in synchronization with the reference signal and extracts the single polarity signal, even if normal-mode noise is included in the current in the detection coil, it will still be possible to remove such normal-mode noise.

The respective fourth resistance measuring apparatuses described above may further include: a first capacitance element that is disposed so as to come after the first operational amplifier and removes a DC component included in the first voltage signal; and a second capacitance element that is disposed so as to come after the second operational amplifier and removes a DC component included in the second voltage signal. By disposing the capacitance elements so as to come after the respective operational amplifiers in this way, even if there are fluctuations in the offset voltages of the respective operational amplifiers, it will be possible to remove the offset voltages (DC voltages), and therefore possible to improve the measurement precision of the resistance value of the measured circuit.

Also, the respective fourth resistance measuring apparatuses described above may further include: a first filter unit that removes a harmonic component of the testing AC signal included in the first voltage signal; and a second filter unit that removes a harmonic component of the testing AC signal included in the second voltage signal. By disposing the first and second filter units in this way, it is possible to remove harmonic components included in the first voltage signal and the second voltage signal. This means it is possible to significantly improve the measurement precision of the resistance value of the measured circuit.

To achieve the stated fifth object, a fifth resistance measuring apparatus according to the present invention includes: a voltage injecting unit that injects a testing AC signal into a measured circuit; a current detecting unit that detects an AC current, which is flowing in the measured circuit due to injection of the testing AC signal, using a detection coil; a storage unit that stores an offset current value for a current value of an AC current flowing in the detection coil; and a processing unit that carries out a resistance calculating process that subtracts the offset current value from the current value of the AC current flowing in the detection coil to calculate a current value flowing in the detection coil and calculates a resistance value of the measured circuit based on the current value and a voltage value of the testing AC signal that is injected, wherein the processing unit is operable when the resistance value calculated in the resistance calculating process is in an offset updating possible state that is one state out of a state where the resistance value is equal to or greater than a resistance threshold set in advance and a state where the resistance value is negative, to carry out an offset updating process that stores the current value of the AC current flowing in the detection coil in the storage unit as a new offset current value.

According to the fifth resistance measuring apparatus, when the resistance value calculated in the resistance calculating process is in an offset updating possible state that is one state out of a state where the resistance value is equal to or greater than a resistance threshold set in advance and a state where the resistance value is negative, the processing unit carries out the offset updating process that stores the current value of the AC current flowing in the detection coil in the storage unit as a new offset current value. This means that the resistance value is always calculated using the most recent offset current value. As a result, even when an offset is produced due to a change in environmental conditions such as temperature and humidity and/or changes over time in electronic components, it will still always be possible to measure the resistance value with high precision.

Another fifth resistance measuring apparatus according to the present invention includes: a voltage injecting unit that injects a testing AC signal into a measured circuit; a current detecting unit that detects an AC current, which is flowing in the measured circuit due to injection of the testing AC signal, using a detection coil; a storage unit that stores an offset current value for a current value of an AC current flowing in the detection coil; and a processing unit that carries out a resistance calculating process that subtracts the offset current value from the current value of the AC current flowing in the detection coil to calculate a current value flowing in the detection coil and calculates a resistance value of the measured circuit based on the current value and a voltage value of the testing AC signal that is injected, wherein the processing unit is operable when the calculated current value is in an offset updating possible state where the current value is equal to or less than a current threshold set in advance, to carry out an offset updating process that stores the current value of the AC current flowing in the detection coil in the storage unit as a new offset current value.

According to the other fifth resistance measuring apparatus described above, when the current value flowing in the detection coil that has been calculated in the resistance calculating process is in an offset updating possible state where the current value is equal to or less than a current threshold set in advance, the processing unit carries out the offset updating process that stores the current value of the AC current flowing in the detection coil in the storage unit as a new offset current value. This means that the resistance value is always calculated using the most recent offset current value. As a result, even when an offset is produced due to a change in environmental conditions and/or changes over time in electronic components, it will still always be possible to measure the resistance value with high precision.

Also, in the respective fifth resistance measuring apparatuses described above, the processing unit may be operable when the offset updating possible state continues for a predetermined time or longer, to carry out the offset updating process. With this construction, by carrying out the offset updating process when the offset updating possible state has continued for the predetermined time or longer, i.e., when the current value of the AC current flowing in the detection coil is stable, it will be possible to avoid having the offset current value updated when the current value of the AC current is not stable, and as a result, it is possible to sufficiently improve the reliability of the measured resistance value of the measured circuit.

Also, the respective fifth resistance measuring apparatuses described above may further include an operation unit that generates an updating signal in accordance with an operation content and outputs the updating signal to the processing unit, wherein the processing unit is operable only when the updating signal has been inputted and the offset updating possible state is present, to carry out the offset updating process. With this construction, by having the operator operate the operation unit, the offset current value can be updated at the timing desired by the operator.

Also, in the respective fifth resistance measuring apparatuses described above, the voltage injecting unit may generate the testing AC signal in synchronization with a reference signal, the current detecting unit may include: a first amplifier unit that includes at least a first operational amplifier with an inverted input terminal connected to one end of the detection coil and a non-inverted input terminal into which a reference voltage is inputted, converts a current flowing in the detection coil to a first voltage signal, and outputs the first voltage signal; a second amplifier unit that includes at least a second operational amplifier with an inverted input terminal connected to another end of the detection coil and a non-inverted input terminal into which the reference voltage is inputted, converts a current flowing in the detection coil to a second voltage signal with opposite phase to the first voltage signal, and outputs the second voltage signal; a first extraction unit that carries out synchronous detection on the first voltage signal and the second voltage signal in synchronization with the reference signal to extract a positive polarity signal composed of only positive side parts of waveforms of the first voltage signal and the second voltage signal; a second extraction unit that carries out synchronous detection on the first voltage signal and the second voltage signal in synchronization with the reference signal to extract a negative polarity signal composed of only negative side parts of waveforms of the first voltage signal and the second voltage signal; and a differential amplifier unit that outputs a difference signal on a difference between the positive polarity signal and the negative polarity signal, and the current detecting unit may detect the AC current flowing in the measured circuit based on the difference signal.

With the above construction, since it is possible to avoid the use of a single-ended detection coil and the use of a shunt resistor, it is possible to achieve favorable frequency characteristics while maintaining a sufficient detection gain. Also, since the first amplifier unit and the second amplifier unit that are connected to the respective ends of the detection coil output the first voltage signal and the second voltage signal with respectively opposite phase based on the current flowing in the detection coil, and the differential amplifier unit outputs the difference signal on a difference between the positive polarity signal and the negative polarity signal generated by the extraction units based on such signals, even if common-mode noise is superimposed on the current flowing in the detection coil, it will still be possible to cancel the common-mode noise in the differential amplifier unit. Also, since the extraction units carry out synchronous detection on the first and second voltage signals in synchronization with the reference signal and extract the positive polarity signal and the negative polarity signal, even if normal-mode noise is included in the current in the detection coil, it will still be possible to remove such normal-mode noise.

Also, in the respective fifth resistance measuring apparatuses described above, the voltage injecting unit may generate the testing AC signal in synchronization with a reference signal, the current detecting unit may include: a first amplifier unit that includes at least a first operational amplifier with an inverted input terminal connected to one end of the detection coil and a non-inverted input terminal into which a reference voltage is inputted, converts a current flowing in the detection coil to a first voltage signal, and outputs the first voltage signal; a second amplifier unit that includes at least a second operational amplifier with an inverted input terminal connected to another end of the detection coil and a non-inverted input terminal into which the reference voltage is inputted, converts a current flowing in the detection coil to a second voltage signal with opposite phase to the first voltage signal, and outputs the second voltage signal; a third amplifier unit that outputs a difference signal on a difference between the first voltage signal and the second voltage signal; and an extraction unit that carries out synchronous detection on the difference signal in synchronization with the reference signal to extract a single polarity signal composed of one of the positive-side part and the negative-side part of a waveform of the difference signal, and the current detecting unit may detect the AC current flowing in the measured circuit based on the single polarity signal. With the above construction, since it is possible to avoid the use of a single-ended detection coil and the use of a shunt resistor, it is possible to achieve favorable frequency characteristics while maintaining a sufficient detection gain. Also, since the first amplifier unit and the second amplifier unit that are connected to the respective ends of the detection coil output the first voltage signal and the second voltage signal with respectively opposite phase based on the current flowing in the detection coil, and the differential amplifier unit outputs the difference between such signals as the difference signal, even if common-mode noise is superimposed on the current flowing in the detection coil, it will still be possible to cancel the common-mode noise in the differential amplifier unit. Also, since the extraction unit carries out synchronous detection on the difference signal in synchronization with the reference signal and extracts the single polarity signal, even if normal-mode noise is included in the current in the detection coil, it will still be possible to remove such normal-mode noise.

It should be noted that the disclosure of the present invention relates to the contents of Japanese Patent Application 2008-170042 that was filed on 30 Jun. 2008, Japanese Patent Application 2008-183316 that was filed on 15 Jul. 2008, Japanese Patent Application 2008-202631 that was filed on 6 Aug. 2008, Japanese Patent Application 2008-277617 that was filed on 29 Oct. 2008, Japanese Patent Application 2009-035022 that was filed on 18 Feb. 2009, Japanese Patent Application 2009-045836 that was filed on 27 Feb. 2009, and Japanese Patent Application 2009-048833 that was filed on 3 Mar. 2009, the entire contents of which are herein incorporated by reference.

BRIEF DESCRIPTION OF THE DRAWINGS

These and other objects and features of the present invention will be explained in more detail below with reference to the attached drawings, wherein:

FIG. 19 is a circuit diagram of a current measuring unit, except for an A/D converter unit;

FIG. 25 is a flowchart useful in explaining another offset updating process carried out by either of the fifth resistance measuring apparatuses.

DESCRIPTION OF THE PREFERRED EMBODIMENTS

Preferred embodiments of a resistance measuring apparatus according to the present invention will now be described with reference to the attached drawings.

First, the construction of a resistance measuring apparatus 1 will be described with reference to the drawings as a first and second resistance measuring apparatus according to the present invention.

Figure 1:
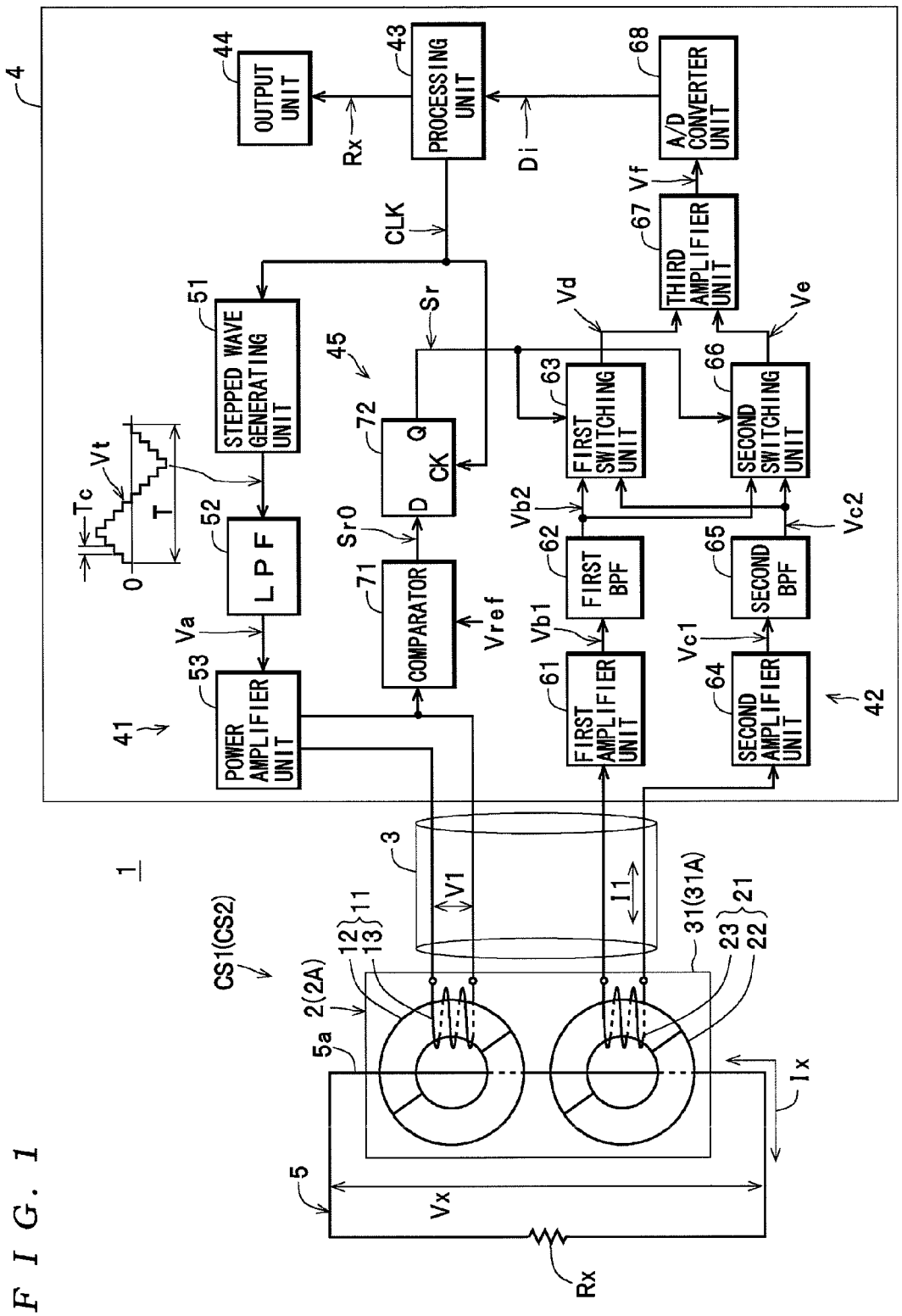
FIG. 1 is a block diagram showing the construction of a resistance measuring apparatus as a first resistance measuring apparatus and a second resistance measuring apparatus.

The resistance measuring apparatus 1 shown in FIG. 1 includes a clamp sensor CS1, and an apparatus main unit 4 connected to the clamp sensor CS1 via a cable 3, and is constructed so as to be capable of measuring the resistance value Rx for the resistance (i.e., loop resistance) of a measured circuit 5.

Figure 10:
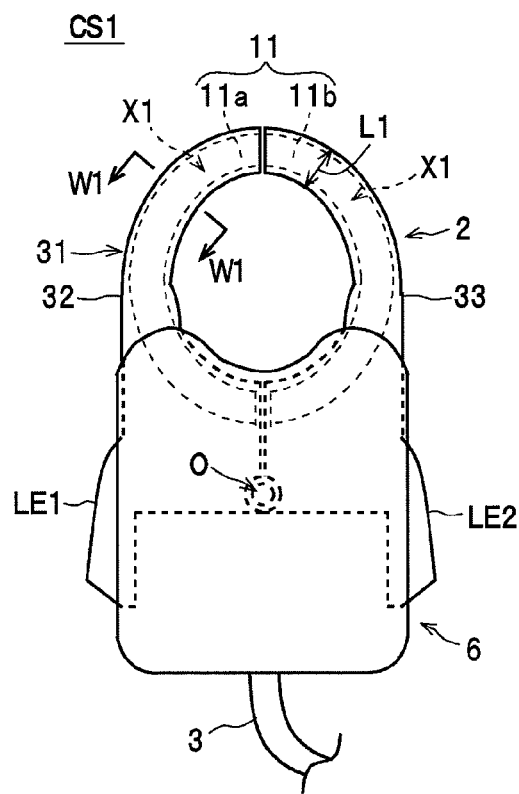
FIG. 10 is a front view of a clamp sensor.
Figure 11:
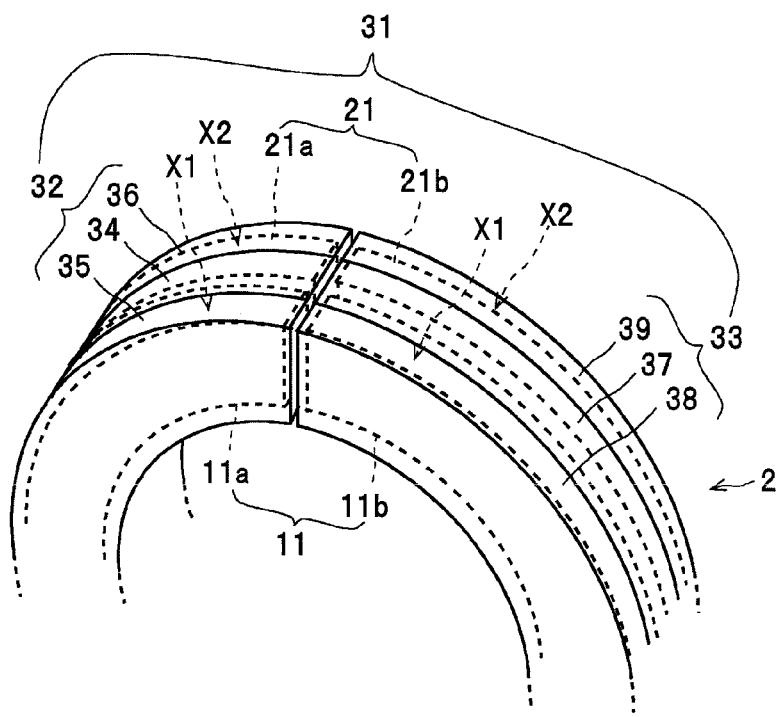
FIG. 11 is an enlarged perspective view of a clamp unit of the clamp sensor.

As shown in FIG. 10, as one example the clamp sensor CS1 includes a clamp unit 2 that clamps onto the measured circuit 5 and a grip portion 6 that holds the clamp unit 2 so that the clamp unit 2 is freely openable and closable. As shown in FIGS. 1, 10, and 11, the clamp unit 2 includes an injection clamp unit 11, a detection clamp unit 21, and a housing 31. In the present embodiment, as shown in FIG. 10, the housing 31 includes a first housing 32 and a second housing 33 that are composed of an insulating resin material and constructs a clamp-type housing. In the present embodiment, as one example, the first housing 32 and the second housing 33 are formed in substantially the same form and are rotatably attached to the grip portion 6 in a state where the first and second housings 32 and 33 face one another. Also, as shown in FIG. 10, end portions at one end (hereinafter, "first end") of the first housing 32 and the second housing 33 (the upper end portions in FIG. 10) protrude in the same direction (upward in FIG. 10) from the grip portion 6, are formed in arc shapes, and are constructed so as to form a ring shape when the ends are brought together.

Also, as an example, the end portions at the other end of the first housing 32 and the second housing 33 are axially supported at a center position of the grip portion 6 (the position shown by the letter "O") so as to be freely rotatable. Lever portions LE1, LE2 that protrude from the grip portion 6 are formed on the front tip of the end portions at this other end of the first housing 32 and the second housing 33. The first housing 32 and the second housing 33 are constantly energized by a spring, not shown, disposed inside the grip portion 6 in a direction that brings the first end portions of the first housing 32 and the second housing 33 together (i.e., in a direction where the lever portions LE1, LE2 protrude from the grip portion 6). With this construction, by carrying out an operation that presses the lever portions LE1, LE2 inside the grip portion 6 against the energizing force of the spring, it is possible to rotate the first housing 32 and the second housing 33 in opposite directions and thereby move the end portions at the first end apart.

As shown in FIG. 11, the first housing 32 and the second housing 33 each have a three-piece structure where the respective housings are divided in three in the thickness direction. More specifically, as shown in FIG. 11, the first housing 32 has a three-piece construction that includes a middle housing 34 and a pair of side housings 35, 36 that are disposed on both sides of the middle housing 34 so as to sandwich the middle housing 34. In the same way, as shown in FIG. 11, the second housing 33 has a three-piece construction that includes a middle housing 37 and a pair of side housings 38, 39 that are disposed on both sides of the middle housing 34 so as to sandwich the middle housing 34.

Next, the constructions of the housings 34, 35, 36 that construct the first housing 32, the constructions of the housings 37, 38, 39 that construct the second housing 33, and the overall constructions of the first housing 32 and the second housing 33 will be described in detail. Note that since the first housing 32 and the second housing 33 are formed with substantially the same form and the same overall construction as described above, the constructions of the housings 34, 35, 36 that construct the first housing 32 and the overall construction of the first housing 32 will be described with reference to FIG. 12 and description of the constructions of the housings 37, 38, 39 that construct the second housing 33 and the overall construction of the second housing 33 is omitted.

Figure 12:
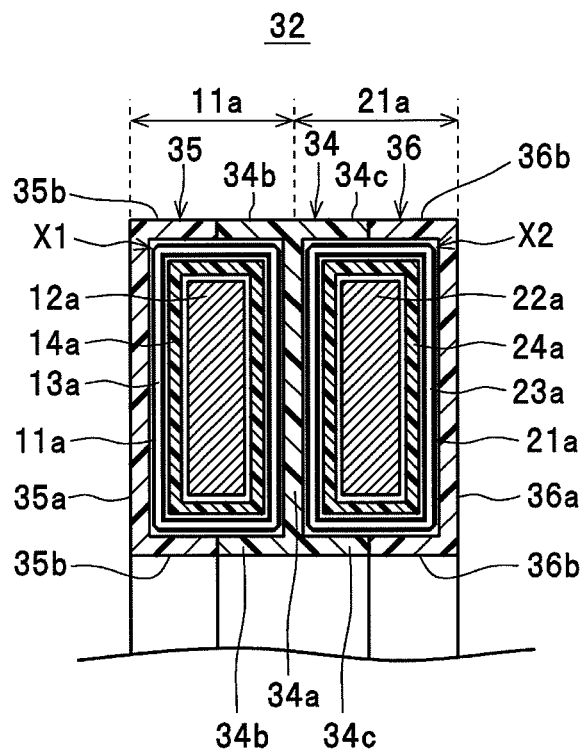
FIG. 12 is a cross-sectional view of a first housing in FIG. 10 taken along a line W1-W1.

The middle housing 34 includes a first plate-shaped member 34a formed with substantially the same planar shape as the first housing 32 shown in FIG. 10, a first wall portion 34b that is erected on one surface of the first plate-shaped member 34a along the outer edge of the first plate-shaped member 34a, and a second wall portion 34c erected on the other surface of the first plate-shaped member 34a in the opposite direction to the first wall portion 34b along the outer edge of the first plate-shaped member 34a. One of the side housings, i.e., the side housing 35, includes a second plate-shaped member 35a formed in substantially the same planar shape as the first housing 32 shown in FIG. 10 (that is, substantially the same planar shape as the middle housing 34), and a third wall portion 35b that is erected on a surface of the second plate-shaped member 35a that faces the middle housing 34 along the outer edge of the second plate-shaped member 35a. The other side housing, i.e., the side housing 36, includes a third plate-shaped member 36a formed in substantially the same planar shape as the first housing 32 shown in FIG. 10 (that is, substantially the same planar shape as the middle housing 34), and a fourth wall portion 36b that is erected on a surface of the third plate-shaped member 36a that faces the middle housing 34 along the outer edge of the third plate-shaped member 36a. This means that in a state where the third wall portion 35b of the second plate-shaped member 35a and the first wall portion 34b of the first plate-shaped member 34a have been brought together and the fourth wall portion 36b of the third plate-shaped member 36a and the second wall portion 34c of the first plate-shaped member 34a have been brought together, inside the first housing 32 that is constructed with the side housings 35, 36 disposed on both sides of the middle housing 34 so as to sandwich the middle housing 34, as shown in FIGS. 11 and 12, a gap X1 is formed between the second plate-shaped member 35a and third wall portion 35b and the first plate-shaped member 34a and first wall portion 34b (i.e., between the housings 34, 35) and a gap X2 is formed between the third plate-shaped member 36a and fourth wall portion 36b and the first plate-shaped member 34a and second wall portion 34c (i.e., between the housings 34, 36). Also, inside the second housing 33 that is composed of the housings 37, 38, 39 that have the same respective constructions as the housings 34, 35, 36 of the first housing 32 and has the same overall construction as the first housing 32, as shown in FIG. 11, the gap X1 is formed between the housings 37, 38 and the gap X2 is formed between the housings 37, 39.

As one example, as shown in FIGS. 10 and 11, the injection clamp unit 11 includes an arc-shaped first injection clamp unit 11a and an arc-shaped second injection clamp unit 11b. The first injection clamp unit 11a is disposed inside the gap X1 at the first end of the first housing 32 and the second injection clamp unit 11b is disposed inside the gap X1 at the first end of the second housing 33. As one example, as shown in FIG. 11, the detection clamp unit 21 includes an arc-shaped first detection clamp unit 21a and an arc-shaped second detection clamp unit 21b. The first detection clamp unit 21a is disposed inside the gap X2 at the first end of the first housing 32 and the second detection clamp unit 21b is disposed inside the gap X2 at the first end of the second housing 33.

With this construction, as shown in FIGS. 11 and 12, the first injection clamp unit 11a disposed inside the gap X1 of the first housing 32 and the first detection clamp unit 21a disposed inside the gap X2 of the same first housing 32 become stacked in the thickness direction thereof (the left-right direction in FIG. 12, which is also the thickness direction of the first housing 32) with only the first plate-shaped member 34a of the middle housing 34 that constructs the first housing 32. In the same way, the second injection clamp unit 11b disposed inside the gap X1 of the second housing 33 and the second detection clamp unit 21b disposed inside the gap X2 of the same second housing 33 become stacked in the thickness direction thereof (the thickness direction of the second housing 33) as shown in FIG. 11 with only the plate-shaped member (a member that corresponds to the first plate-shaped member 34a of the middle housing 34 and is not shown) of the middle housing 37 that constructs the second housing 33. That is, in this construction, it is possible to omit a shield material (a metal plate or sheet) that would normally be disposed between the injection clamp unit 11 and the detection clamp unit 21 to reduce leakage of the magnetic field generated by the injection clamp unit 11 into the detection clamp unit 21. Accordingly, with the clamp unit 2 (the housing 31), there is a large reduction in the overall thickness (the length in the left-right direction in FIG. 12) of the injection clamp unit 11 and the detection clamp unit 21.

Next, the specific constructions of the first injection clamp unit 11a, the second injection clamp unit 11b, the first detection clamp unit 21a, and the second detection clamp unit 21b will be described with reference to FIG. 12. Note that since the second injection clamp unit 11b has substantially the same construction as the first injection clamp unit 11a and the second detection clamp unit 21b has substantially the same construction as the first detection clamp unit 21a, the constructions of the first injection clamp unit 11a and the first detection clamp unit 21a will be described and description of the constructions of the second injection clamp unit 11b and the second detection clamp unit 21b is omitted.

As shown in FIG. 12, the first injection clamp unit 11a includes an arc-shaped core 12a, a bobbin 14a that is attached onto the arc-shaped core 12a, and a coil 13a that is wound around the bobbin 14a. Also, although not shown, in the same way as the first injection clamp unit 11a, the second injection clamp unit 11b described above includes another arc-shaped core 12a, another bobbin 14a that is attached onto the other arc-shaped core 12a, and another coil 13a that is wound around the other bobbin 14a. The two arc-shaped cores 12a are produced by dividing a first ring-shaped core 12 shown in FIG. 1. Also, the two bobbins 14a are constructed of an insulating resin material. The two coils 13a are connected in series and construct a first coil 13 (with a known number of turns: N1) shown in FIG. 1, or in other words, a single injection coil.

As shown in FIG. 12, the first detection clamp unit 21a includes an arc-shaped core 22a, a bobbin 24a that is attached onto the arc-shaped core 22a, and a coil 23a that is wound around the bobbin 24a. Also, although not shown, in the same way as the first detection clamp unit 21a, the second detection clamp unit 21b described above includes another arc-shaped core 22a, another bobbin 24a that is attached onto the other arc-shaped core 22a, and another coil 23a that is wound around the other bobbin 24a. The two arc-shaped cores 22a are produced by dividing a second ring-shaped core 22 shown in FIG. 1. Also, the two bobbins 24a are constructed of an insulating resin material. The two coils 23a are connected in series and construct a second coil 23 (with a known number of turns: N2) shown in FIG. 1, or in other words, a single detection coil.

The injection clamp unit 11 and the detection clamp unit 21 constructed in this way are both enclosed in a clamp-shaped housing 31 that is made of a resin material and that has a front end that can be freely opened and closed. More specifically, as described above, the first injection clamp unit 11a that constructs the injection clamp unit 11 is disposed inside the gap X1 at the first end of the first housing 32 and the second injection clamp unit 11b that constructs the injection clamp unit 11 is disposed inside the gap X1 at the first end of the second housing 33, and the second detection clamp unit 21a that constructs the detection clamp unit 21 is disposed inside the gap X2 at the first end of the first housing 32 and the second detection clamp unit 21b that constructs the detection clamp unit 21 is disposed inside the gap X2 at the first end of the second housing 33. This means that when an opening or closing operation of the housing 31 (a rotation operation of the housings 32, 33) is carried out, the first ring-shaped core 12 of the injection clamp unit 11 and the second ring-shaped core 22 of the detection clamp unit 21 are simultaneously opened or closed. That is, when an opening or closing operation of the housing 31 is carried out, the first injection clamp unit 11a and the second injection clamp unit 11b are opened or closed and the first detection clamp unit 21a and the second detection clamp unit 21b are also opened or closed.

Accordingly, when the housing 31 has been closed as shown in FIG. 10 from an opened state (a state where the first end portion of the first housing 32 and the first end portion of the second housing 33 are separated), not shown, or in other words, when the first end portion of the first housing 32 and the first end portion of the second housing 33 have been brought together, the first injection clamp unit 11a and the second injection clamp unit 11b will become closed (i.e., the injection clamp unit 11 will become closed). Also, although not shown, when the housing 31 is closed, the first detection clamp unit 21a and the second detection clamp unit 21b will also become closed at the same time as the first injection clamp unit 11a and the second injection clamp unit 11b (i.e., the detection clamp unit 21 will also become closed).

Since the injection clamp unit 11 that includes the first coil 13 as the injection coil and the detection clamp unit 21 that includes the second coil 23 as the detection coil are enclosed in a single housing 31, by opening the housing 31 and placing a wire 5a that constructs part of the measured circuit 5 inside the housing 31, the wire 5a will become placed inside the first ring-shaped core 12 and the second ring-shaped core 22 that have been opened. By then closing the housing 31 in this state, the wire 5a will become simultaneously clipped (clamped) by the first ring-shaped core 12 and the second ring-shaped core 22 that have been closed, or in other words, the wire 5a will become clipped by the clamp unit 2. In this state, the wire 5a will function as one winding of the first ring-shaped core 12 and the second ring-shaped core 22.

As shown in FIG. 1, the apparatus main unit 4 includes a voltage injecting unit 41, a current measuring unit 42, a processing unit 43, an output unit 44, and a reference signal generating unit 45. The voltage injecting unit 41 includes a stepped wave generating unit 51, a low pass filter (hereinafter "LPF") 52, a power amplifier unit 53, and the injection clamp unit 11. Here, the stepped wave generating unit 51 generates and outputs a triangular wave signal Vt with a predetermined period T (frequency f). The triangular wave signal Vt is one example of a "stepped wave" for the present invention and, as shown in FIG. 1, is a signal with the overall shape of a triangular wave where the amplitude changes in steps at a cycle Tc of a reference clock CLK.

Figure 5:
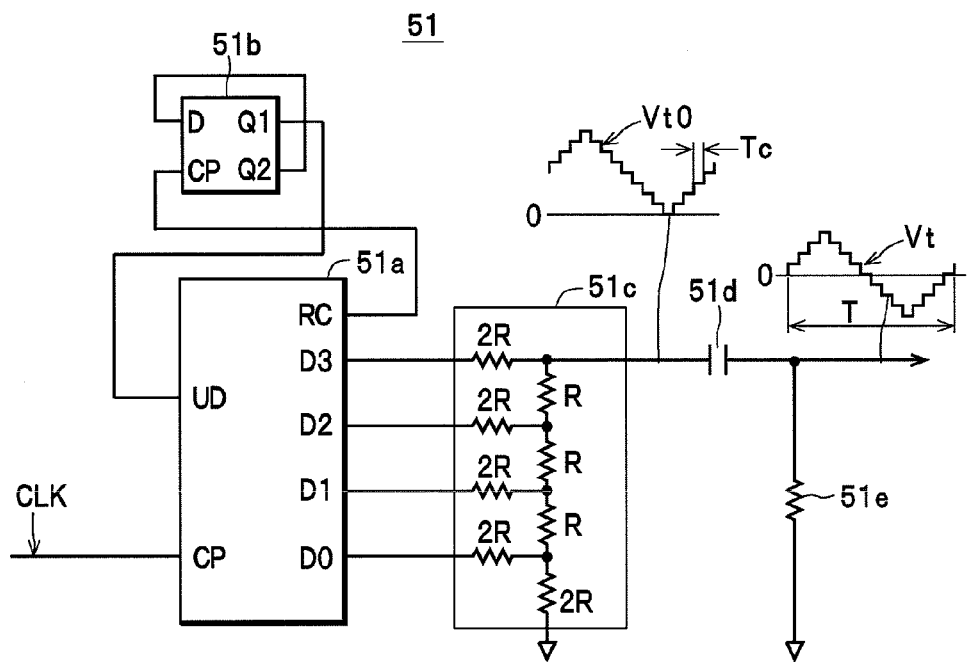
FIG. 5 is a circuit diagram of a stepped wave generating unit.

As one example, as shown in FIG. 5, the stepped wave generating unit 51 includes a counter (an up-down counter, as one example a 4-bit binary up-down counter) 51a that operates in synchronization with the reference clock CLK and is capable of selectively carrying out one of an up-count operation and a down-count operation, a flip-flop (as one example, a D flip-flop) 51b for causing the counter 51a to repeatedly carry out up-count operations and down-count operations, a D/A conversion circuit 51c that generates a stepped wave Vt0 based on a count value outputted from counter output terminals D3 to D0 of the counter 51a (more specifically, by subjecting the count value to D/A conversion), a capacitor 51d that cuts a DC component included in a stepped wave Vt0, and a resistor 51e (with a resistance of 100 kΩ to 1MΩ, for example) for setting the center voltage of the stepped wave Vt0 from which the DC component has been cut by the capacitor 51d at zero volts.

Here, as one example, the counter 51a is constructed of a 74HCT191 and an inverter (for example, a 74HCT04) that inverts and outputs a ripple clock of the 74HCT191 (neither component is shown). The counter 51a carries out a count operation in accordance with the level of the signal inputted into an up-down control terminal UD (i.e., a down-count operation when the level is "Low" and an up-count operation when the level is "High") in synchronization with the reference clock CLK inputted into a clock input terminal CP. When the count value being outputted from the counter output terminals D3 to D0 is "1111" (in binary) during an up-count operation and when the count value being outputted from the counter output terminals D3 to D0 is "0000" (in binary) during a down-count operation, the counter 51a causes the level of the ripple clock outputted from the ripple clock terminal RC to switch from "Low" to "High". As shown in FIG. 5, an inverted output terminal Q2 and a data input terminal D of the flip-flop 51b are connected, a non-inverted output terminal Q1 of the flip-flop 51b is connected to the up-down control terminal UD of the counter 51a, and a clock input terminal CP of the flip-flop 51b is connected to the ripple clock terminal RC of the counter 51a.

With this construction, every time the ripple clock is inputted into the clock input terminal CP, the flip-flop 51b inverts the levels of the output signals outputted from the output terminals Q1, Q2 in synchronization with a rise in the ripple clock. This means that when the count value outputted from the counter output terminals D3 to D0 becomes "1111" during an up-count operation, the level of the signal inputted into the up-down control terminal UD of the counter 51a will change from "High" to "Low" to switch the counter 51a to a down-count operation. By doing so, the counter 51a is caused to decrement the count value from "1111". After this, when the count value becomes "0000", the level of the signal inputted into the up-down control terminal UD of the counter 51a will change from "Low" to "High" to switch back to an up-count operation. By doing so, the counter 51a is caused to increment the count value from "0000". In this way, while the reference clock CLK is being inputted, the counter 51a repeats an up-down count operation in synchronization with the reference clock CLK between a start value (in this example, "0000") and an end value (in this example, "1111") that are set in advance.

As shown in FIG. 5, the D/A conversion circuit 51c is constructed for example of a resistance ladder circuit (in FIG. 5, "R" and "2R" respectively show resistance values where "2R" is twice the resistance of "R") and generates the stepped wave Vt0 as a DC signal. The capacitor 51d cuts the DC component included in the stepped wave Vt0 and outputs the stepped wave Vt as an AC signal. By receiving input of the triangular wave signal Vt and mainly passing the fundamental frequency component (with the frequency f) and attenuating other frequency components (i.e., by selectively passing the fundamental frequency component), the LPF 52 converts the triangular wave signal Vt to an AC voltage (a quasi-sinusoidal signal) Va shown in FIG. 3 and outputs the AC voltage Va.

In the present embodiment, as one example the power amplifier unit 53 is constructed of a class D amplifier, amplifies the AC voltage Va by a predetermined gain to generate an AC voltage V1 of a voltage (an "effective voltage" in the present embodiment) set in advance, and applies the generated AC voltage V1 to the first coil 13 of the injection clamp unit 11. Although not shown, as one example the power amplifier unit 53 includes a signal generating circuit that generates a sawtooth signal of a certain frequency, a PWM signal generating circuit that compares the sawtooth signal and the AC voltage Va and generates a pulse signal (PWM signal) of a predetermined period whose pulse width (i.e., duty ratio) changes proportionately to the amplitude of the AC voltage Va, a class D power amplification circuit that amplifies the power of the PWM signal, and a low-pass filter circuit that generates the AC voltage V1 by subjecting the output signal from the class D power amplification circuit to a filtering process. By doing so, a testing AC signal Vx of a predetermined effective voltage value and a predetermined frequency f is injected via the injection clamp unit 11 into the measured circuit 5. In this case, since the wire 5a functions as mentioned above as one winding of the first ring-shaped core 12, the testing AC signal Vx injected into the measured circuit 5 has a voltage (Vx=V1/N1) obtained by dividing the AC voltage V1 by the number of turns N1. Since the wire 5a also functions as one winding of the second ring-shaped core 22, the detection clamp unit 21 detects an AC current Ix flowing in the measured circuit 5 and outputs the detected current (i.e., the current flowing in the detection coil) I1 (=Ix/N2) to the second coil 23.

Figure 2:
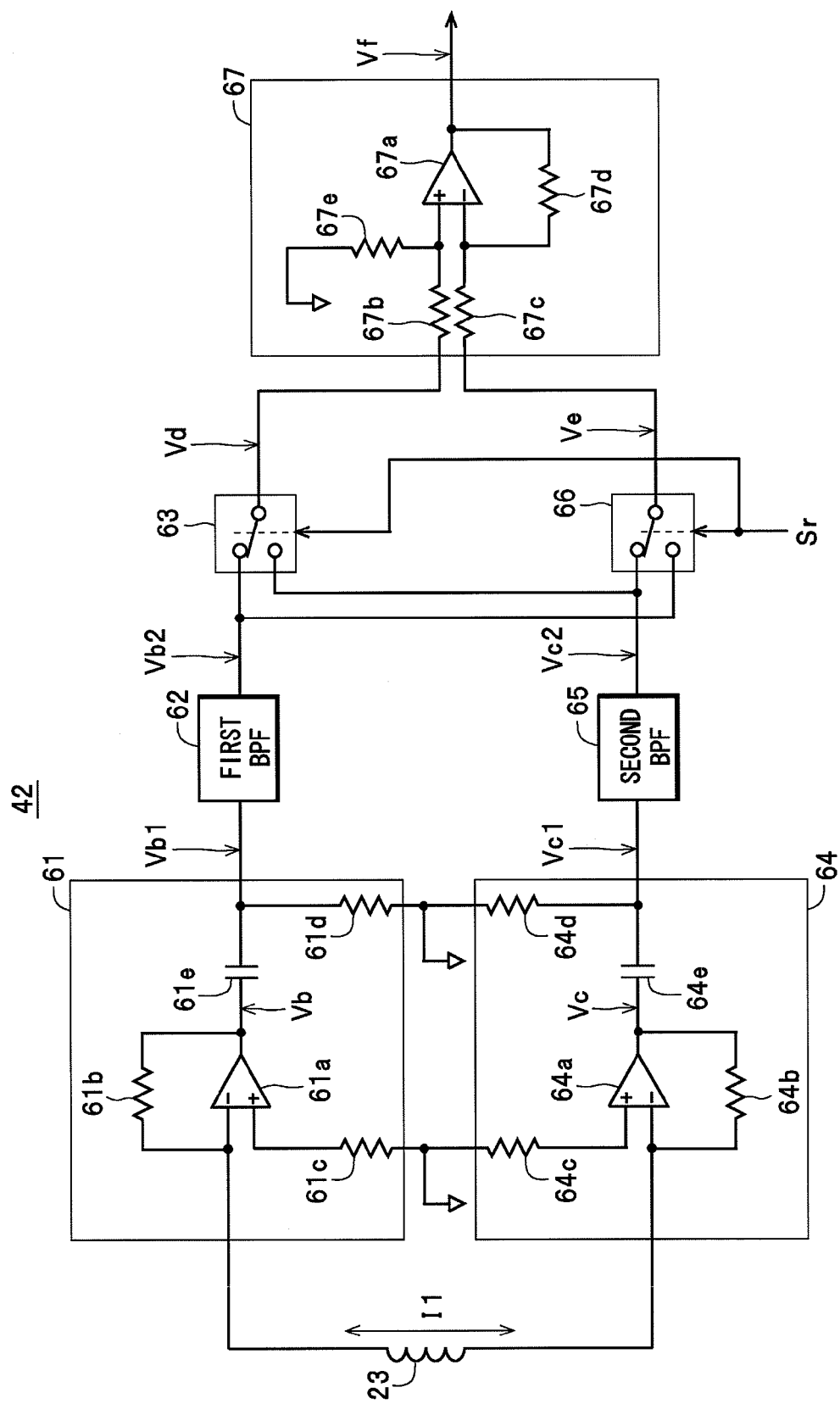
FIG. 2 is a circuit diagram of a current measuring unit, except for an A/D converter unit.

The current measuring unit 42 includes the detection clamp unit 21, a first amplifier unit 61, a first band-pass filter (hereinafter simply "first BPF") 62, a first switching unit 63, a second amplifier unit 64, a second band-pass filter (hereinafter simply "second BPF") 65, a second switching unit 66, a third amplifier unit 67, and an A/D converter unit 68. The first amplifier unit 61 functions as a current-to-voltage conversion circuit, is connected to a first end of the second coil 23, converts a detection current I1 generated at the first end of the second coil 23 to a first voltage signal Vb1, and outputs the first voltage signal Vb1. As one example, as shown in FIG. 2, the first amplifier unit 61 includes a first operational amplifier 61a, resistors 61b, 61c, 61d, and a first capacitor 61e. Here, the first operational amplifier 61a is constructed with an inverted input terminal directly connected to the first end of the second coil 23, the resistor 61b is connected between the inverted input terminal and the output terminal as a feedback resistor, the non-inverted input terminal is grounded via the resistor 61c (one example where the reference voltage (ground) is inputted), and the inputted detection current I1 is converted to a voltage signal Vb (a signal whose amplitude changes proportionately to the current value of the detection current I1) and outputted. The first capacitor 61e is one example of a "first capacitance element", is disposed so as to come after the first operational amplifier 61a (in the present embodiment, one end of the first capacitor 61e is directly connected to the output terminal of the first operational amplifier 61a) and removes the DC component included in the voltage signal Vb. The other end of the first capacitor 61e is grounded via the resistor 61d. By doing so, the DC level of the voltage signal Vb from which the DC component has been removed by the first capacitor 61e is set at ground potential (zero volts), and the voltage signal Vb is outputted from the first amplifier unit 61 as a first voltage signal Vb1 that is an AC signal that changes about a center of zero volts.

Figure 3:
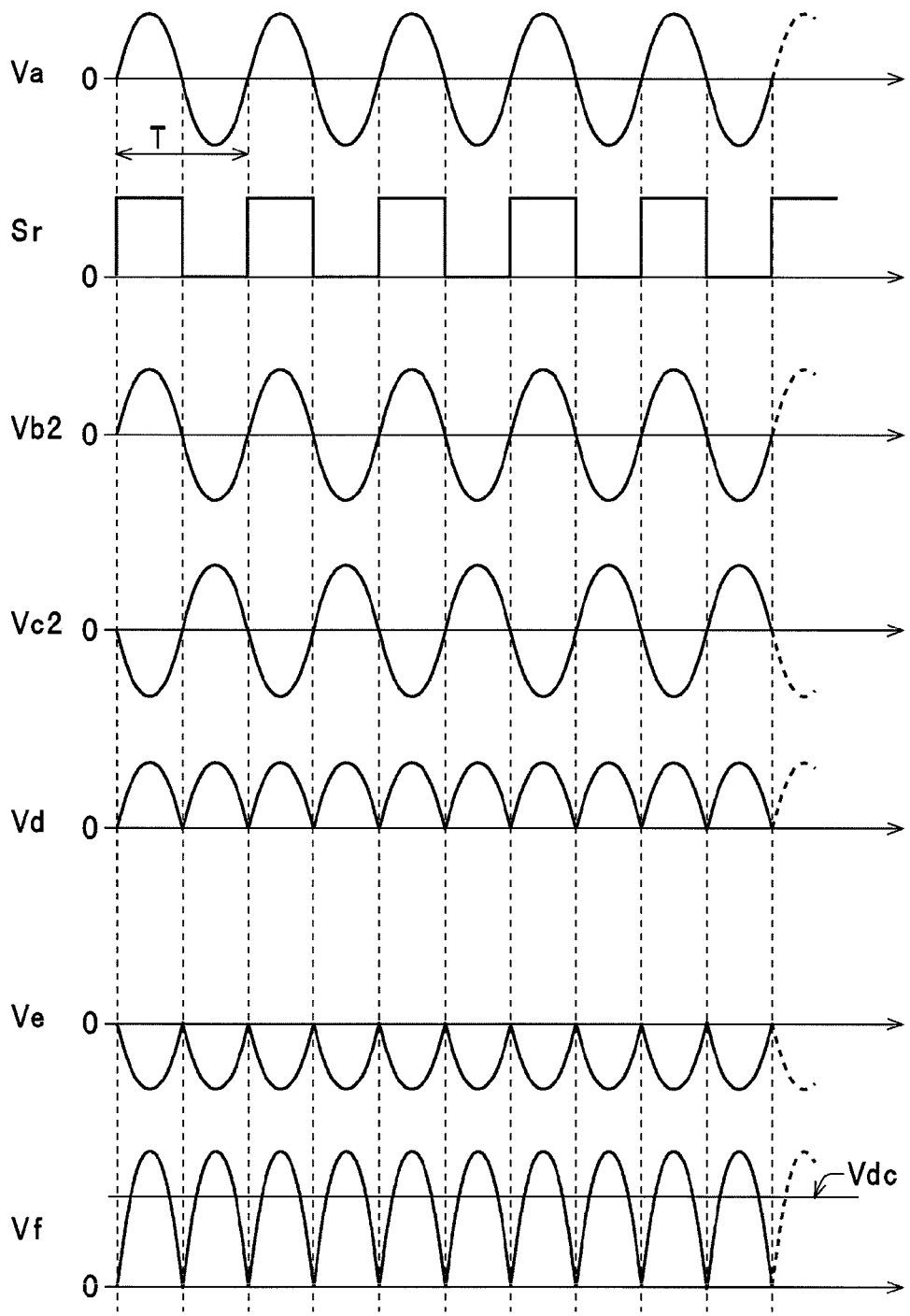
FIG. 3 is a waveform diagram useful in explaining the operation of the current measuring unit.

The first BPF 62 is a "first filter unit" and is constructed of a band-pass filter, for example. By removing harmonic components of the AC voltage Va that are included in the inputted first voltage signal Vb1 (i.e., by carrying out a filtering process), the first BPF 62 outputs the first voltage signal Vb1 as a first voltage signal Vb2. More specifically, by selectively (and mainly) passing a fundamental frequency component in the AC voltage Va included in the first voltage signal Vb1 (i.e., a component with the frequency f: the fundamental frequency component of the testing AC signal Vx), the first BPF 62 outputs the first voltage signal Vb2. The first switching unit 63 is constructed of an analog switch, for example, and functions as a synchronous detection circuit ("first extraction unit"). The first switching unit 63 synchronizes with a reference signal Sr outputted from the reference signal generating unit 45 (a pulse signal that is synchronized with (i.e., has the same phase as) the AC voltage Va and has a duty ratio of 0.5), and as shown in FIG. 3, switches at half-cycle intervals between and outputs the first voltage signal Vb2 and a second voltage signal Vc2, described later, outputted from the second BPF 65 (i.e., the first switching unit 63 carries out a synchronous detection operation). By doing so, the first switching unit 63 generates (extracts) and outputs a positive-polarity signal (synchronous detection signal) Vd that is a pulsed flow signal and is composed of the positive-side part of the waveform of the first voltage signal Vb2 and the positive-side part of the waveform of the second voltage signal Vc2.

The second amplifier unit 64 functions as a current-to-voltage conversion circuit, is connected to the other end of the second coil 23, converts the detection current I1 generated at the other end of the second coil 23 to a second voltage signal Vc1, and outputs the second voltage signal Vc1. As one example, as shown in FIG. 2, the second amplifier unit 64 includes a second operational amplifier 64a, resistors 64b, 64c, 64d, and a second capacitor 64e, and therefore has the same construction as the first amplifier unit 61. Here, the second operational amplifier 64a is constructed with an inverted input terminal directly connected to the other end of the second coil 23, the resistor 64b is connected between the inverted input terminal and the output terminal as a feedback resistor, the non-inverted input terminal is grounded via the resistor 64c (one example where the reference voltage (ground) is inputted), and the inputted detection current I1 is converted to a voltage signal Vc (a signal whose amplitude changes proportionately to the current value of the detection current I1 and has an inverse polarity to the voltage signal Vb) and outputted. The second capacitor 64e is one example of a "second capacitance element", is disposed so as to come after the second operational amplifier 64a (in the present embodiment, one end of the second capacitor 64e is directly connected to the output terminal of the second operational amplifier 64a) and removes the DC component included in the voltage signal Vc. The other end of the second capacitor 64e is grounded via the resistor 64d. By doing so, the DC level of the voltage signal Vc from which the DC component has been removed by the second capacitor 64e is set at ground potential (zero volts), and the voltage signal Vc is outputted from the second amplifier unit 64 as a second voltage signal Vc1 that is an AC signal that changes about a center of zero volts. Here, the detection current I1 generated at the other end of the second coil 23 has inverted phase to the detection current I1 generated at the first end of the second coil 23. This means that the second operational amplifier 64a converts the inputted detection current I1 to the voltage signal Vc that has inverted phase to the voltage signal Vb and outputs the voltage signal Vc. By doing so, the second amplifier unit 64 generates and outputs the second voltage signal Vc1 that is an AC signal that changes about a center of zero volts and has inverted phase to the first voltage signal Vb1.

The second BPF 65 is a "second filter unit" and as one example is constructed of a band-pass filter in the same way as the first BPF 62. By removing harmonic components of the AC voltage Va that are included in the inputted second voltage signal Vc1 (i.e., by carrying out a filtering process), the second BPF 65 outputs the second voltage signal Vc1 as the second voltage signal Vc2. The second switching unit 66 has the same construction as the first switching unit 63 and functions as a synchronous detection circuit ("second extraction unit"). The second switching unit 66 synchronizes with the reference signal Sr, and as shown in FIG. 3, switches between and outputs the first voltage signal Vb2 and the second voltage signal Vc2 at half-cycle intervals (i.e., the second switching unit 66 carries out a synchronous detection operation). By doing so, the second switching unit 66 generates (extracts) and outputs a negative-polarity signal (synchronous detection signal) Ve that is a pulsed flow signal and is composed of a negative-side part of the waveform of the first voltage signal Vb2 and a negative-side part of the waveform of the second voltage signal Vc2.

Together with the switching units 63 and 66, the third amplifier unit 67 functions as a synchronous detection circuit. The third amplifier unit 67 receives an input of the positive-polarity signal Vd and the negative-polarity signal Ve, calculates the difference between the polarity signals Vd, Ve, and amplifies the difference by a predetermined gain. The result is then outputted as a detection output signal Vf that is the final synchronous detection signal. Note that since the detection output signal Vf is the difference between the polarity signals Vd, Ve, the detection output signal Vf is also referred to below as the "difference signal Vf". As shown in FIG. 2, as one example in the present embodiment, the third amplifier unit 67 includes an operational amplifier 67a, a resistor 67b that is connected between the first switching unit 63 and the non-inverted input terminal of the operational amplifier 67a, a resistor 67c that is connected between the second switching unit 66 and the inverted input terminal of the operational amplifier 67a, a resistor 67d connected between the inverted input terminal and the output terminal of the operational amplifier 67a, and a resistor 67e that is connected between the non-inverted input terminal of the operational amplifier 67a and a reference voltage (in this example, ground), and is constructed as a differential amplifier unit. By using this construction, as shown in FIG. 3, the third amplifier unit 67 calculates and outputs the difference signal Vf that is a pulsed flow signal that is synchronized with the positive-polarity signal Vd and the negative-polarity signal Ve (in the present embodiment, as one example the difference signal Vf is a pulsed flow signal constructed of a positive-side waveform, but may be a pulsed flow signal constructed of a negative-side waveform) as the difference between the polarity signals Vd and Ve. To do so, the third amplifier unit 67 that calculates and amplifies the difference between the polarity signals Vd, Ve has the construction described above and functions as a broadband amplifier. Since the difference signal Vf is generated as described above based on the voltage signals Vb, Vc whose amplitudes are respectively proportional to the current value of the detection current I1, the amplitude of the difference signal Vf itself is also proportional to the current value of the detection current I1. The A/D converter unit 68 converts the difference signal Vf to digital data and outputs the result as current data Di. Accordingly, the current data Di outputted from the A/D converter unit 68 is data that shows the detection current I1.

The reference signal generating unit 45 includes a comparator 71 and a class D flip-flop (one example of a "synchronous circuit unit", hereinafter simply "DFF") 72, functions overall as a comparator, and generates and outputs a reference signal (binary signal) Sr based on the AC voltage V1. More specifically, the comparator 71 has the comparison voltage Vref set at zero volts and as one example in the present embodiment is constructed so as to exhibit hysteresis. With this construction, the comparator 71 compares the AC voltage V1 that is a quasi-sinusoidal signal and the comparison voltage Vref, and generates and outputs a pulse signal, which has a duty ratio of 0.5 and a polarity that inverts at the zero cross of the AC voltage V1, as a binary signal (a preliminary binary signal that is generated by binarizing the AC voltage V1 and serves as a precursor to the reference signal Sr which is the final binary signal) Sr0. Since the comparator 71 exhibits hysteresis, when the voltage value of the AC voltage V1 exceeds the comparison voltage Vref, by lowering the comparison voltage Vref below zero volts, it is possible to avoid unnecessary inversion of the polarity of the binary signal Sr0 due to noise superimposed on the AC voltage V1, and as a result, the effects of noise are reduced and the measurement precision of the resistance value Rx is improved. The DFF 72 synchronizes the binary signal Sr0 inputted into the D input terminal to the reference clock CLK inputted into the clock terminal CK (i.e., the DFF 72 matches rises and falls in the binary signal Sr0 with rises (or falls) in the reference clock CLK) and outputs the reference signal Sr as the final binary signal. In this case, by constructing a synchronous circuit unit using the DFF 72, the reference signal Sr that has been generated by reliably synchronizing the binary signal Sr0 to the reference clock CLK will be outputted. Note that when there is little phase displacement in the detection current I1 with respect to the AC voltage V1, it is possible to supply the binary signal Sr0 to the switching units 63 and 66 as the final binary signal in place of the reference signal Sr, and therefore the DFF 72 may be omitted from the construction.

The processing unit 43 includes a CPU and a memory (neither of which is shown), and carries out a resistance measuring process. The output unit 44 is constructed of a monitor apparatus, for example, and displays the result of the resistance measuring process.

Figure 4:
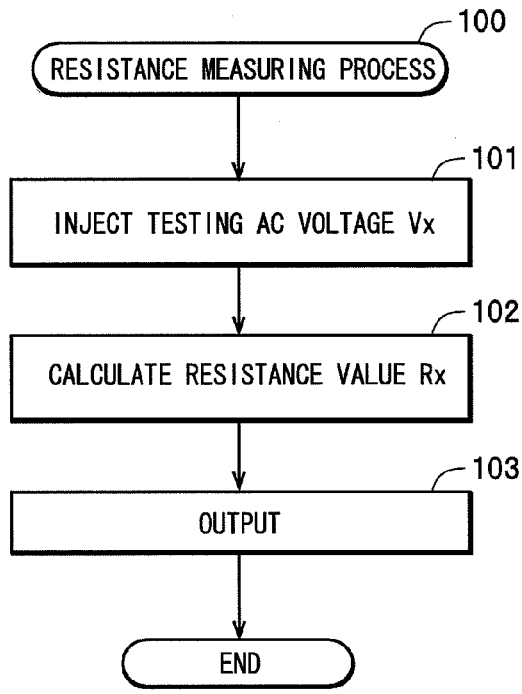
FIG. 4 is a flowchart useful in explaining a resistance measuring process carried out by the first and second resistance measuring apparatuses.

Next, a resistance measuring process 100 carried out by the resistance measuring apparatus 1 will be described with reference to FIG. 4.

In the resistance measuring process 100, the processing unit 43 first carries out an injection process that injects the testing AC signal Vx with a predetermined frequency f into the measured circuit 5 (step 101). More specifically, in the injection process, to cause the voltage injecting unit 41 to start generating the AC voltage Va, the processing unit 43 starts outputting the reference clock CLK. The reference clock CLK is outputted to the stepped wave generating unit 51 and the DFF 72. By doing so, in the voltage injecting unit 41, the stepped wave generating unit 51 generates the triangular wave signal Vt that is synchronized to the reference clock CLK and starts outputting the generated triangular wave signal Vt, and the LPF 52 converts the triangular wave signal Vt to the AC voltage Va. The power amplifier unit 53 carries out a class D amplification operation to amplify the inputted AC voltage Va by a predetermined gain and thereby generate the AC voltage V1 of an effective voltage set in advance and applies the generated AC voltage V1 to the first coil 13 of the injection clamp unit 11. By doing so, the testing AC signal Vx (with the frequency f) is injected into the measured circuit 5 from the injection clamp unit 11. As a result, an AC current Ix of the frequency f flows in the measured circuit 5 due to the testing AC signal Vx being injected. On the other hand, in the reference signal generating unit 45, by comparing the AC voltage V1 and the comparison voltage Vref, the comparator 71 starts generating the binary signal Sr0 whose polarity is inverted at the zero cross of the AC voltage V1 and has a duty ratio of 0.5. The DFF 72 also starts processing that synchronizes the binary signal Sr0 to the reference clock CLK and outputs the result as the reference signal Sr. By doing so, the supplying of the reference signal Sr from the reference signal generating unit 45 to the switching units 63 and 66 of the current measuring unit 42 is commenced.

In a state where the testing AC signal Vx with the frequency f is being injected into the measured circuit 5, the current measuring unit 42 carries out a process that detects the AC current Ix and generates the current data Di. More specifically, in the current measuring unit 42, the detection clamp unit 21 detects the AC current Ix that flows in the measured circuit 5 and outputs the detection current I1 from the second coil 23, and the first and second amplifier units 61 and 64 convert the detection current I1 to the first and second voltage signals Vb1, Vc1 and output the first and second voltage signals Vb1, Vc1. Here, unlike the conventional construction (i.e., a construction where the second coil 23 as the detection coil is single-ended and a resistor for detecting current is connected in series), the current measuring unit 42 uses a construction where both ends of the second coil 23 are connected to the inverted input terminals of the operational amplifiers 61a and 64a. By doing so, it is possible to eliminate a resistor ("shunt resistor") for detecting current which would carry the risk of reducing gain and causing deterioration in the frequency characteristics, and thereby achieve favorable frequency characteristics while maintaining a sufficient detection gain. Note that in the resistance measuring apparatus 1, since the injection clamp unit 11 and the detection clamp unit 21 are enclosed near one another in a single housing 31, magnetic flux generated by the first coil 13 of the injection clamp unit 11 is directly inputted into the second coil 23 of the detection clamp unit 21. For this reason, the detection current I1 outputted from the second coil 23 includes a current component ("first current component") generated due to the AC current Ix flowing in the measured circuit 5 and a current component ("second current component") whose phase is shifted by 90° with respect to the first current component and is generated due to the magnetic flux from the first coil 13.

Next, the first and second BPFs 62 and 65 remove the harmonic components included in the corresponding voltage signals Vb1 and Vc1 and output the resulting signals as the first and second voltage signals Vb2 and Vc2. By switching between the first and second voltage signals Vb2 and Vc2 in synchronization with the reference signal Sr (i.e., by carrying out synchronous detection using the reference signal Sr), the switching units 63 and 66 generate and output the positive-polarity signal Vd and the negative-polarity signal Ve based on only the first current component included in the detection current I1. Note that since the phase of the second current component included in the detection current I1 is shifted by 90° with respect to the first current component, the second current component will be completely removed by synchronous detection based on the reference signal Sr. In this case, the reference signal Sr is outputted via the DFF 72 of the reference signal generating unit 45. This means that even if the phase of the AC voltage V1 with respect to the reference clock CLK has changed due to changes in temperature and/or humidity, provided that such change in phase is within one cycle of the reference clock CLK, the rises and falls in the reference signal Sr will be forcibly synchronized by the DFF 72 with rises (or falls) in the reference clock CLK. Accordingly, there is a large reduction in the phase shift of the reference signal Sr relative to the reference clock CLK due to changes in temperature and/or humidity, that is, there is a large reduction in fluctuations in the duty ratio of the reference signal Sr. This means that it is possible for the switching units 63 and 66 to stably switch between the first and second voltage signals Vb2 and Vc2 based on the reference signal Sr, and as a result it is possible to increase the precision with which the switching units 63 and 66 generate the positive-polarity signal Vd and the negative-polarity signal Ve. Also, even if normal-mode noise is included in the detection current I1, such normal-mode noise will be removed by the switching operations carried out as described above on the voltage signals Vb2, Vc2 by the switching units 63 and 66 in synchronization with the reference signal Sr.

Next, the third amplifier unit 67 calculates the difference between the positive-polarity signal Vd and the negative-polarity signal Ve and thereby generates the difference signal Vf, and the A/D converter unit 68 converts the difference signal Vf to digital data and outputs such data to the processing unit 43 as the current data Di. In this case, in the current measuring unit 42, the first amplifier unit 61 and the second amplifier unit 64 that are connected to the respective ends of the second coil 23 output the first voltage signal Vb1 and the second voltage signal Vc1 that have inverted phase based on the detection current I1 generated at the ends of the second coil 23, and the third amplifier unit 67 calculates the difference between the positive-polarity signal Vd and the negative-polarity signal Ve generated by the switching units 63 and 66 based on the voltage signals Vb1, Vc1 and thereby generates the difference signal Vf. This means that even if common-mode noise is superimposed on the detection current I1, such noise can be cancelled by the third amplifier unit 67 carrying out the difference calculation.

Next, the processing unit 43 carries out a calculation process that calculates the resistance value Rx of the measured circuit 5 when the frequency is "f" (step 102). More specifically, in this calculation process, the processing unit 43 first calculates the current value (in the present embodiment, the effective current value) of the detection current I1 based on the current data Di, and then calculates the effective voltage value of the testing AC signal Vx based on the effective voltage value of the AC voltage V1 and the number of turns (N1) in the first coil 13 and also calculates the current value (in the present embodiment, the effective current value) of the AC current Ix based on the effective current value of the calculated detection current I1 and the number of turns (N2) in the second coil 23. Next, the processing unit 43 calculates the resistance value Rx of the measured circuit 5 when the frequency of the testing AC signal Vx is f based on the effective values of the testing AC signal Vx and the AC current Ix that have been calculated and stores the calculated resistance value Rx in the memory corresponding to the frequency f. In the present embodiment, as one example, when calculating the resistance value Rx, the processing unit 43 calculates the resistance value Rx multiple times, calculates the average of such values (as one example, a moving average), and then sets the average as the final resistance value Rx. By doing so, the calculation process for the resistance value Rx is completed. Finally, the processing unit 43 outputs the calculated resistance value Rx to the output unit 44 (step 103). By doing so, the resistance measuring process is completed.

In this way, with the resistance measuring apparatus 1, the voltage injecting unit 41 generates the triangular wave signal Vt that changes in synchronization with the reference clock CLK and generates the AC voltage V1 by carrying out a filtering process on the triangular wave signal Vt using the LPF 52. Also, by applying the AC voltage V1 to the first coil 13, the voltage injecting unit 41 causes the testing AC signal Vx to be generated inside the measured circuit 5. The comparator 71 of the reference signal generating unit 45 generates the binary signal Sr0 based on the AC voltage V1 and the DFF 72 of the reference signal generating unit 45 synchronizes the binary signal Sr0 to the reference clock CLK and outputs the result as the reference signal Sr. The current measuring unit 42 converts the detection current I1 flowing in the second coil 23 due to the injection of the testing AC signal Vx to the voltage signals Vb2, Vc2, carries out synchronous detection on the voltage signals Vb2, Vc2 using the reference signal Sr, and measures the current value of the detection current I1 (that is, the current value of the AC current Ix that is proportional to the current value of the detection current I1) based on the difference signal Vf obtained by the synchronous detection.

Therefore, according to the resistance measuring apparatus 1, even if the phase of the AC voltage V1 has changed with respect to the reference clock CLK due to changes in temperature and/or humidity, provided that the change in phase is within one cycle of the reference clock CLK, it will be possible to forcibly synchronize rises and falls in the reference signal Sr with rises (or falls) in the reference clock CLK. As a result, it will be possible to greatly reduce any shift in phase between the reference signal Sr and the reference clock CLK due to changes in temperature and/or humidity, that is, it will be possible to greatly reduce fluctuations in the duty ratio of the reference signal Sr. Accordingly, according to the resistance measuring apparatus 1, it is possible for the switching units 63 and 66 to stably switch between the first and the second voltage signal Vb2 and Vc2 based on the reference signal Sr, and it is possible to increase the precision with which the switching units 63 and 66 generate the positive-polarity signal Vd and the negative-polarity signal Ve. As a result, it is possible to sufficiently improve the measurement precision of the resistance value Rx while avoiding the use of a high Q band-pass filter.

According to the resistance measuring apparatus 1, by constructing a synchronous circuit unit using the DFF 72, it is possible to reliably synchronize the binary signal Sr0 to the reference clock CLK and output the result as the reference signal Sr.

According to the resistance measuring apparatus 1, by using the comparator 71 that exhibits hysteresis, it is possible to reduce the effects of noise and further improve the measurement accuracy of the resistance value Rx of the measured circuit 5.

According to the resistance measuring apparatus 1, by constructing the power amplifier unit 53 of the voltage injecting unit 41 of a Class D amplifier, it is possible to amplify the AC voltage Va to the AC voltage V1 with low loss and as a result, it is possible to sufficiently improve the efficiency of the apparatus. Accordingly, even with the same power consumption, it is possible to efficiently amplify the AC voltage V1 and therefore possible to reduce the inductance of the first coil 13 as the injection coil. This means it is possible to reduce the thickness of the first ring-shaped core 12 that constructs the injection clamp unit 11, or in other words, to reduce the thickness of the injection clamp unit 11, and as a result, it is possible to make the clamp unit 2 thinner. When the power amplifier unit 53 is constructed of a Class D amplifier, a large amount of high-frequency noise will be included in the AC voltage V1. However, since the AC voltage V1 amplified by the power amplifier unit 53 and the reference signal Sr for synchronous detection are both generated in synchronization with the reference clock CLK, it will be possible to carry out accurate synchronous detection of the voltage signals Vb2 and Vc2, which are voltages generated by converting the detection current I1 that flows in the second coil 23 as the detection coil due to the injection of the testing AC signal Vx, using the reference signal Sr. As a result, it is possible to improve the noise tolerance of the resistance measuring apparatus 1.

According to the resistance measuring apparatus 1, since the injection clamp unit 11 that includes the first coil 13 as the injection coil and the detection clamp unit 21 that includes the second coil 23 as the detection coil are enclosed within a single clamp-type housing 31, it is possible to clip the injection clamp unit 11 that includes the first coil 13 as the injection coil and the detection clamp unit 21 that includes the second coil 23 as the detection coil onto the wire 5a that constructs part of the measured circuit 5 with a single clipping operation (a single clamping operation), which makes it easier to measure resistance using the resistance measuring apparatus 1. Also, since it is possible to make the positional relationship between the injection clamp unit 11 and the detection clamp unit 21 stable (i.e., can be disposed in predetermined positions), when the resistance value Rx is repeatedly measured for the same measured circuit 5, it is possible to stabilize the measurement results (i.e., to reduce fluctuations in the measured resistance values Rx), and to improve the precision of repeated measurement.

Also, with the resistance measuring apparatus 1, the voltage injecting unit 41 injects the testing AC signal Vx into the measured circuit 5 by applying the AC voltage V1, which is synchronized with the reference signal Sr, to the first coil 13, and the current measuring unit 42 converts the detection current I1 flowing in the second coil 23 due to the injection of the testing AC signal Vx to the voltage signals Vb2, Vc2 and carries out synchronous detection on the voltage signals Vb2, Vc2 using the reference signal Sr to measure the current value of the detection current I1 (that is, the current value of the AC current Ix that is proportional to the current value of the detection current I1) based on the difference signal Vf obtained by the synchronous detection. Therefore, according to the resistance measuring apparatus 1, although magnetic flux from the injection clamp unit 11 will directly leak into the detection clamp unit 21 due to the injection clamp unit 11 and the detection clamp unit 21 being enclosed in a single housing 31, by carrying out synchronous detection using the reference signal Sr, it is possible to completely remove the second current component generated in the AC current Ix due to such leaking magnetic flux. Since it is possible to generate the difference signal Vf based on only the first current component that is generated due to the AC current Ix flowing in the measured circuit 5, it is possible to measure the current value of the detection current I1 (that is, the current value of the AC current Ix that is proportional to the current value of the detection current I1) with sufficiently high precision. Since it is also unnecessary to dispose a shield material between the injection clamp unit 11 and the detection clamp unit 21, it is possible to reduce the overall thickness of the injection clamp unit 11 and the detection clamp unit 21, which means that the clamp unit 2 can be made sufficiently thinner.

According to the resistance measuring apparatus 1, since the injection clamp unit 11, which includes the first coil 13 as the injection coil, and the detection clamp unit 21, which includes the second coil 23 as the detection coil, are enclosed inside the single housing 31 so that the respective clamp units are stacked in the thickness direction thereof, it is possible to reduce the difference L1 (see FIG. 10) between the inner diameter and the outer diameter of the clamp unit 2 and to clip the clamp unit 2 onto a thicker wire 5a of the measured circuit 5 even with the outer diameter of the clamp unit 2 unchanged. This means that resistance can be measured for a wider range of measured circuits 5.

Also, in the resistance measuring apparatus 1, the current measuring unit 42 includes: the first amplifier unit 61 that includes the first operational amplifier 61a, whose inverted input terminal is connected to one end of the second coil 23, converts the current I1 flowing in the second coil 23 to the first voltage signal Vb1, and outputs the first voltage signal Vb1; the second amplifier unit 64 that includes the second operational amplifier 64a, whose inverted input terminal is connected to the other end of the second coil 23, converts the current I1 flowing in the second coil 23 to the second voltage signal Vc1 that has inverted phase (i.e., opposite phase) to the first voltage signal Vb1, and outputs the second voltage signal Vc1; the first switching unit 63 that carries out synchronous detection (by switching at half-cycle intervals) on the first voltage signal Vb2 and the second voltage signal Vc2 in synchronization with the reference signal Sr and outputs the positive-polarity signal Vd composed of only the positive-side parts of the waveforms of the first voltage signal Vb2 and the second voltage signal Vc2; the second switching unit 66 that carries out synchronous detection (by switching at half-cycle intervals) on the first voltage signal Vb2 and the second voltage signal Vc2 in synchronization with the reference signal Sr and outputs the negative-polarity signal Ve composed of only the negative-side parts of the waveforms of the first voltage signal Vb2 and the second voltage signal Vc2; and the third amplifier unit 67 that calculates the difference between the positive-polarity signal Vd and the negative-polarity signal Ve and outputs the difference as the difference signal Vf.

On the other hand, in the conventional resistance measuring apparatus, since the detection coil that is formed in the detection transformer is grounded at one end (i.e., is "single-ended"), it is necessary to connect a shunt resistor in parallel to the detection coil, and the construction is susceptible to the effects of an induced current that flows to ground due to induction from the periphery. This means it is necessary to provide the detection transformer with a shield to reduce such effects and to connect such shield to ground. However, there is the problem that connecting a shield to ground in this way is disadvantageous for safety standards (as one example, International Safety Standard IEC 61010).

Accordingly, compared to the conventional resistance measuring apparatus, since the resistance measuring apparatus 1 can avoid the use of a single-ended second coil 23 and the use of a shunt resistor, it is possible to clear safety standards and to achieve favorable frequency characteristics while maintaining a sufficient detection gain. Since the first amplifier unit 61 and the second amplifier unit 64 connected to the respective ends of the second coil 23 output the first voltage signal Vb1 and the second voltage signal Vc1 that have respectively inverted phase based on the detection current I1 that is generated in the second coil 23 and the third amplifier unit 67 generates the difference signal Vf by calculating the difference between the positive-polarity signal Vd and the negative-polarity signal Ve generated in the switching units 63, 66 based on the signals Vb1, Vc1, even when common-mode noise is superimposed on the detection current I1, it will be possible to cancel the common-mode noise during the difference calculation by the third amplifier unit 67. Also, since the switching units 63, 66 are constructed so as to switch between the first and second voltage signals Vb2, Vc2 in synchronization with the reference signal Sr (i.e., since the switching units 63, 66 carry out synchronous detection) to generate the positive-polarity signal Vd and the negative-polarity signal Ve, even if normal-mode noise is included in the detection current I1, it will still be possible to remove such normal-mode noise.

Also, according to the resistance measuring apparatus 1, by disposing the capacitors 61e, 64e so as to come after the operational amplifiers 61a, 64a, even if the offset voltages of the operational amplifiers 61a, 64a fluctuate, it will still be possible to remove the offset voltage (DC voltage), and therefore it is possible to improve the measurement precision of the effective current value of the AC current Ix, and in turn of the resistance value Rx.

Also, according to the resistance measuring apparatus 1, by disposing the BPFs 62, 65 so as to come after the capacitors 61e, 64e, since it is possible to remove the harmonic components included in the first voltage signal Vb1 and the second voltage signal Vc1, it will be possible to significantly improve the measurement precision of the effective current value of the AC current Ix, and in turn of the resistance value Rx.

Figure 13:
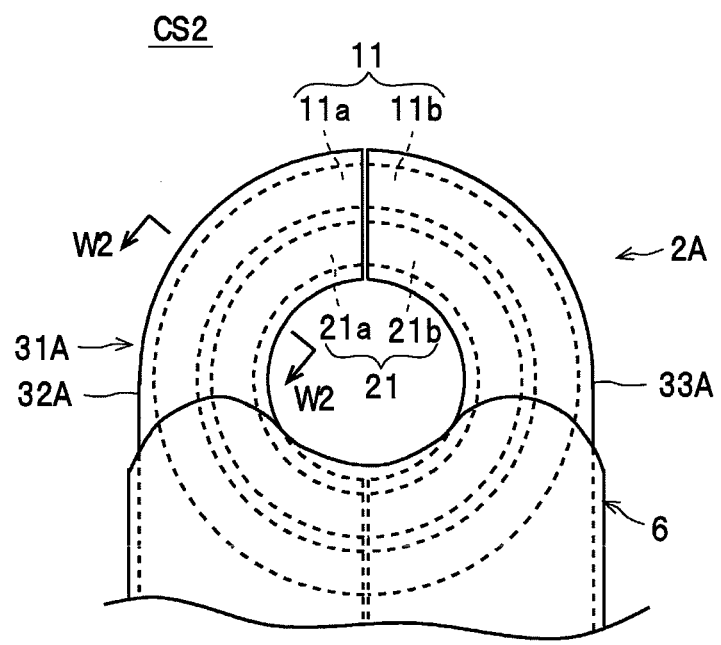
FIG. 13 is an enlarged front view of a clamp unit of another clamp sensor.
Figure 14:
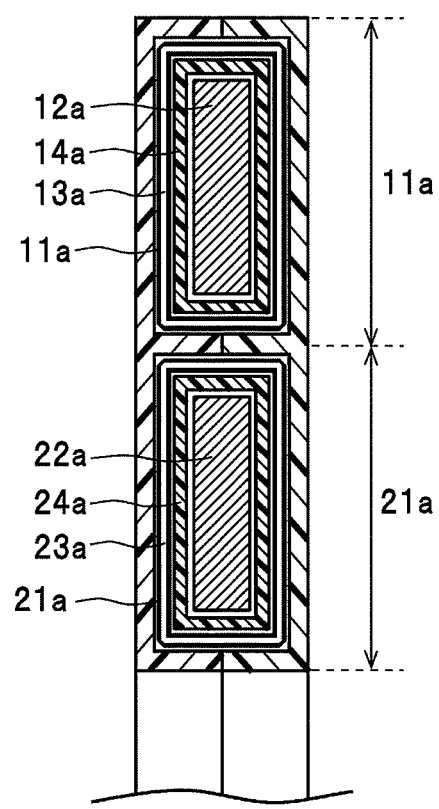
FIG. 14 is a cross-sectional view of a first housing in FIG. 13 taken along a line W2-W2.

Note that the present invention is not limited to the construction described above. Although a construction is used in the example described above where the injection clamp unit 11 that includes the first coil 13 as the injection coil and the detection clamp unit 21 that includes the second coil 23 as the detection coil are enclosed in a single housing 31 so as to be stacked in the thickness direction thereof, it is also possible to apply the present invention to a clamp sensor CS2 with the construction shown in FIG. 13. More specifically, it is also possible to use a construction where the injection clamp unit 11 that includes the first coil 13 as the injection coil and the detection clamp unit 21 that includes the second coil 23 as the detection coil are formed with different diameters and are enclosed in a single housing 31A (a housing made of an insulating resin material) in a state where the clamp portion with the smaller diameter (in FIG. 13, the detection clamp unit 21 for example, that is, the second coil 23 as the detection coil) is positioned inside the other clamp unit with the larger diameter (in FIG. 13, the injection clamp unit 11 for example, that is, the first coil 13 as the injection coil) with the two clamp units (that is, the two coils) being positioned on the same plane. With this construction, compared to a construction where the injection clamp unit 11 and the detection clamp unit 21 are stacked in the thickness direction, it is possible to reduce the thickness of the clamp unit 2A. In this case, as one example, as shown in FIG. 13 the housing 31A includes a first housing 32A and a second housing 33A that respectively correspond to the first housing 32 and the second housing 33 of the housing 31. As one example, the first housing 32A and the second housing 33A each have a two-piece construction where each housing is divided into two in the thickness direction as shown in FIG. 14 (since the housings 32A, 33A have substantially the same construction, only the first housing 32A is shown in FIG. 14), with the injection clamp unit 11 and the detection clamp unit 21 being enclosed inside the respective ends of the housings. Note that parts with the same construction as the clamp sensor CS1 have been assigned the same reference numerals and description thereof is omitted.

Also, although the power amplifier unit 53 is constructed of a Class D amplifier in the construction described above, it is possible to use a Class A or Class AB amplifier in place of the Class D amplifier. In addition, in the reference signal generating unit 45, although the DFF 72 is used when synchronizing the binary signal Sr0 to the reference clock CLK, it is also possible to carry out synchronization using various types of digital circuit (such as a JK flip-flop or an RS flip-flop) aside from a DFF. Also, although the reference signal generating unit 45 is constructed using the comparator 71 that exhibits hysteresis, it is also possible to use a comparator that does not exhibit hysteresis.

Also, although a construction where the reference signal Sr is generated by the reference signal generating unit 45 that includes the comparator 71 and the DFF 72 based on the AC voltage V1 outputted from the power amplifier unit 53 has been described above, it is also possible to use a construction where the reference signal generating unit 45 generates the reference signal Sr based on one out of the triangular wave signal Vt outputted from the stepped wave generating unit 51 and the AC voltage (quasi-sinusoidal signal) Va outputted from the LPF 52. Also, although an example has been described where the reference signal generating unit 45 that generates the reference signal Sr is constructed using the comparator 71 so that the binary signal Sr0 can be reliably generated from the AC voltage V1 with a simple construction, the present invention is not limited to using the comparator 71 and it is possible to use a variety of circuits that are capable of comparing an input value (the voltage value of the AC voltage V1) with a threshold (comparison voltage Vref) and outputting the result of the comparison (the binary signal Sr0).

In the example described above, although a construction is used which changes the level of the signal inputted into the up-down control terminal UD from "High" to "Low" and then from "Low" to "High" cyclically (in T/2 periods) to cause the counter 51$a$ that constructs the stepped wave generating unit 51 to repeat up-count operations and down-count operations and thereby have the triangular wave signal Vt (with the period T) that is a stepped wave that changes in a triangular waveform (i.e., a triangular waveform constructed of a waveform where the amplitude increases in steps from a start value to an end value and a waveform where the amplitude decreases in steps from the end value to the start value) outputted from the stepped wave generating unit 51 and have the AC voltage V1 with a reduced harmonic component outputted from the power amplifier unit 53, the present invention is not limited to such. As examples, it is also possible to use a construction where the level of the signal inputted into the up-down control terminal UD in FIG. 5 is fixed at "High" and the counter 51$a$ is caused to repeat an up-count operation (a count operation where a count value is incremented from a start value to an end value and the count value is then reset to the start value on reaching the end value) with the period T to cause the stepped wave generating unit 51 to output the triangular wave signal Vt that is a stepped wave that changes in the sawtooth pattern shown in FIG. 6, or a construction where the level of the signal inputted into the up-down control terminal UD in FIG. 5 is fixed at "Low" and the counter 51$a$ is caused to repeat a down-count operation (a count operation where a count value is decremented from a start value to an end value and the count value is then reset to the start value on reaching the end value) with the period T to cause the stepped wave generating unit 51 to output the triangular wave signal Vt that is a stepped wave that changes in the sawtooth pattern shown in FIG. 7. With such constructions, although there is a slight increase in the harmonic component included in the AC voltage V1 outputted from the power amplifier unit 53 compared to the construction where the triangular wave signal Vt shown in FIG. 5 is outputted from the stepped wave generating unit 51, since it is possible to omit the flip-flop 51$b$, it is possible to reduce the number of component parts, and in turn the manufacturing cost. Also, like the various examples described above, by constructing the stepped wave generating unit 51 using the counter 51$a$ and the D/A conversion circuit 51$c$, it is possible to reliably generate the desired stepped wave using a simple circuit construction.

Figure 6:
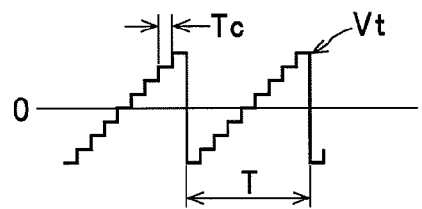
FIG. 6 is a waveform diagram of a triangular wave signal that is a stepped wave that changes in a sawtooth pattern and is outputted from the stepped wave generating unit.
Figure 7:
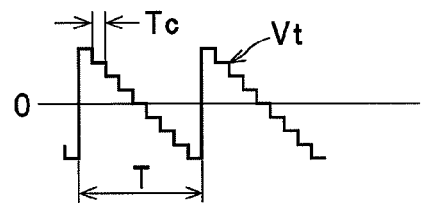
FIG. 7 is a waveform diagram of another triangular wave signal that is a stepped wave that changes in a sawtooth pattern and is outputted from the stepped wave generating unit.
Figure 8:
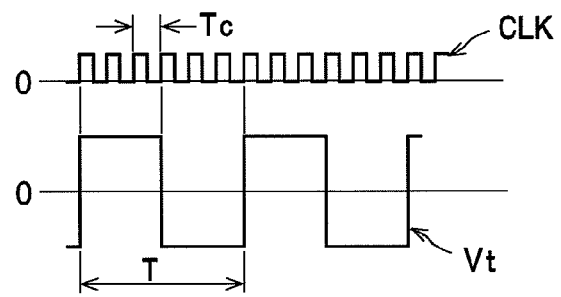
FIG. 8 is a waveform diagram of a rectangular wave that is a stepped wave outputted from the stepped wave generating unit.

It is also possible to use a construction that causes the stepped wave generating unit 51 to generate a rectangular waveform (a rectangular waveform with a period T and a duty ratio of 0.5) that is a stepped waveform whose amplitude changes in a single step in synchronization with the reference clock CLK as shown in FIG. 8, in place of the triangular wave signal Vt that is a stepped wave that changes in a triangular waveform as shown in FIG. 5 or the triangular wave signal Vt that is a stepped wave that changes in a sawtooth waveform as shown in FIGS. 6 and 7, and to output such a rectangular waveform to the LPF 52. Although not shown, the stepped wave generating unit 51 of this construction can be realized by a dividing circuit that divides the reference clock CLK in synchronization with the reference clock CLK and a capacitor that stops a DC component with a rectangular waveform. According to this construction, although there is a further increase in the harmonic component included in the AC voltage V1 outputted from the power amplifier unit 53 compared to a construction that causes the stepped wave generating unit 51 to output a triangular wave signal that is a stepped waveform that changes in a sawtooth pattern, since it becomes possible to omit the D/A conversion circuit 51$c$, it is possible to significantly reduce the number of component parts, and in turn significantly reduce the manufacturing cost.

Figure 9:
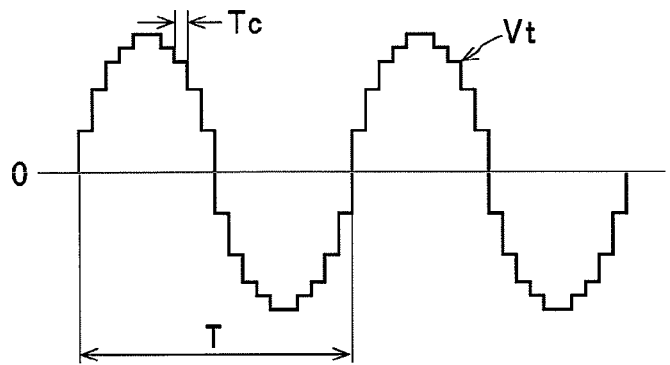
FIG. 9 is a waveform diagram of a quasi-sinusoidal wave that is a stepped wave outputted from the stepped wave generating unit.

Also, although the circuit construction will become complex, it is also possible to apply the present invention to a construction that uses a DDS (Direct Digital Synthesizer, not shown) in the stepped wave generating unit 51. By using this construction, since it is possible to cause the stepped wave generating unit 51 to output, as a quasi-sinusoidal wave Vt, a stepped waveform such as that shown in FIG. 9 that is even closer to a sinusoidal wave than the triangular wave signal Vt, it is possible to cause the power amplifier unit 53 to output an AC voltage V1 that has a significantly smaller harmonic component.

Also, although a construction where the stepped wave generating unit 51 and the reference signal generating unit 45 are provided separately to the processing unit 43 has been described above, it is also possible to apply the present invention to a construction where the processing unit 43 is composed of a DSP (Digital Signal Processor) that includes at least a CPU, an A/D converter, and a D/A converter, and at least one generating unit out of the stepped wave generating unit 51 and the reference signal generating unit 45 is included in the processing unit 43. With this construction, it is possible to construct the stepped wave generating unit 51 by causing the CPU to repeat any out of an up-count operation, a down-count operation, and an up/down-count operation and to output the resulting count value to the D/A converter. It is also possible to construct the stepped wave generating unit 51 by storing waveform data in a memory provided inside or outside the DSP and having the CPU read out the waveform data and output the data to the D/A converter. It is also possible to construct the reference signal generating unit 45 by setting an intermediate value between the start value and the end value of the count operation described above as a reference, having the CPU detect the timing at which the count value crosses such intermediate value, and generating a signal, where rises and falls repeatedly alternate in synchronization with the timing of such detection, as the reference signal Sr.

It is also possible to apply the present invention to a construction where the switching units 63, 66 are omitted from the construction shown in FIG. 1 and the first and second voltage signals Vb2, Vc2 outputted from the first and second BPFs 62, 65 are directly inputted into the third amplifier unit 67. With this construction, by having the third amplifier unit 67, which is constructed of a differential amplifier as shown in FIG. 2, amplify the difference between the first and second voltage signals Vb2, Vc2, an AC signal with an amplitude that is twice the amplitude of the first and second voltage signals Vb2, Vc2 (when the gain is one, for example) will be outputted as the difference signal Vf. The difference signal Vf is converted to digital data by the A/D converter unit 68 and is inputted into the processing unit 43 as the current data Di. This means that by providing at least the reference signal generating unit 45 inside the DSP, the synchronous detection that was carried out by the switching units 63, 66 can be realized by the CPU calculating the current (in the present embodiment, the effective current) of the detection current I1 based on the current data Di in half cycles of the reference signal Sr generated as described above. In this way, by constructing the processing unit 43 of a DSP, including at least one of the stepped wave generating unit 51 and the reference signal generating unit 45 inside the processing unit 43, and providing the processing unit 43 with the functions of a synchronous detection circuit, it is possible to further reduce the number of components and thereby further reduce the manufacturing cost.

Also, although the present invention has been applied in the example described above to a preferable construction where a stepped wave such as the triangular wave signal Vt outputted from the stepped wave generating unit 51 is inputted into the LPF 52 and frequency components aside from the fundamental frequency component (with the frequency f) of the stepped wave are attenuated, if the inclusion of many frequency components aside from the fundamental frequency component (with the frequency f) is not problematic, it is also possible to use a construction that omits the LPF 52, that is, a construction that does not subject the stepped wave to a filtering process. Although an example is described above where the manufacturing cost can be reduced by constructing the D/A conversion circuit 51c included in the stepped wave generating unit 51 of a low-cost resistance ladder circuit, it is also possible to construct the D/A conversion circuit 51c of a resistor string-type, current output-type, or delta-sigma-type conversion circuit.

Note that although the difference signal Vf outputted from the third amplifier unit 67 is directly inputted into the A/D converter unit 68 in the example described above, depending on the specification of the A/D converter unit 68 in use, it may be necessary to amplify the difference signal Vf before input into the A/D converter unit 68. Here, since the dynamic reserve will deteriorate in a construction where a circuit that DC amplifies the difference signal Vf is disposed between the third amplifier unit 67 and the A/D converter unit 68, it is preferable to dispose a circuit that AC amplifies the difference signal Vf between the third amplifier unit 67 and the A/D converter unit 68. A third resistance measuring apparatus 201 that uses this circuit construction will now be described with reference to FIGS. 15 and 16. Note that components that are the same as in the resistance measuring apparatus 1 described above have been assigned the same reference numerals and duplicated description thereof is omitted.

In the resistance measuring apparatus 201, the voltage injecting unit 41 includes a triangular wave generating unit 202, the LPF 52, the power amplifier unit 53, and the injection clamp unit 11. In this case, the triangular wave generating unit 202 is constructed as one example of a D/A converter, and intermittently generates and outputs a triangular waveform signal Ss (a stepped wave) such as that shown in FIG. 15 based on the triangular waveform generation data Ds that is outputted from the processing unit 43 during fixed periods T2 at intervals of a fixed time interval T1. The LPF 52 receives an input of the triangular wave signal Ss, passes mainly the fundamental frequency component (with the frequency f, in this example, around 100 Hz), attenuates the level of a harmonic component with a frequency of at least three times higher, for example, to convert the triangular wave signal Ss to the AC voltage Va (a quasi-sinusoidal signal) shown in FIG. 16, and outputs the AC voltage Va. Although the power amplifier unit 53 generates the AC voltage V1 by amplifying the AC voltage Va by a predetermined gain and applies the generated AC voltage V1 to the first coil 13 of the injection clamp unit 11, the triangular wave signal Ss is an intermittently generated signal as described above, and therefore the power amplifier unit 53 also intermittently generates the AC voltage V1 and applies the AC voltage V1 to the first coil 13.

Also, in the resistance measuring apparatus 201, the current measuring unit 42 includes the detection clamp unit 21, the first amplifier unit 61, the first BPF 62, the first switching unit 63, the second amplifier unit 64, the second BPF 65, the second switching unit 66, the third amplifier unit 67, a low pass filter (hereinafter, simply "LPF") 203, a high pass filter (hereinafter, simply "HPF") 204, an AC amplifier unit 205, and the A/D converter unit 68, and is constructed so as to be capable of detecting the AC current Ix using the detection clamp unit 21 and measuring the current thereof.

Figure 16:
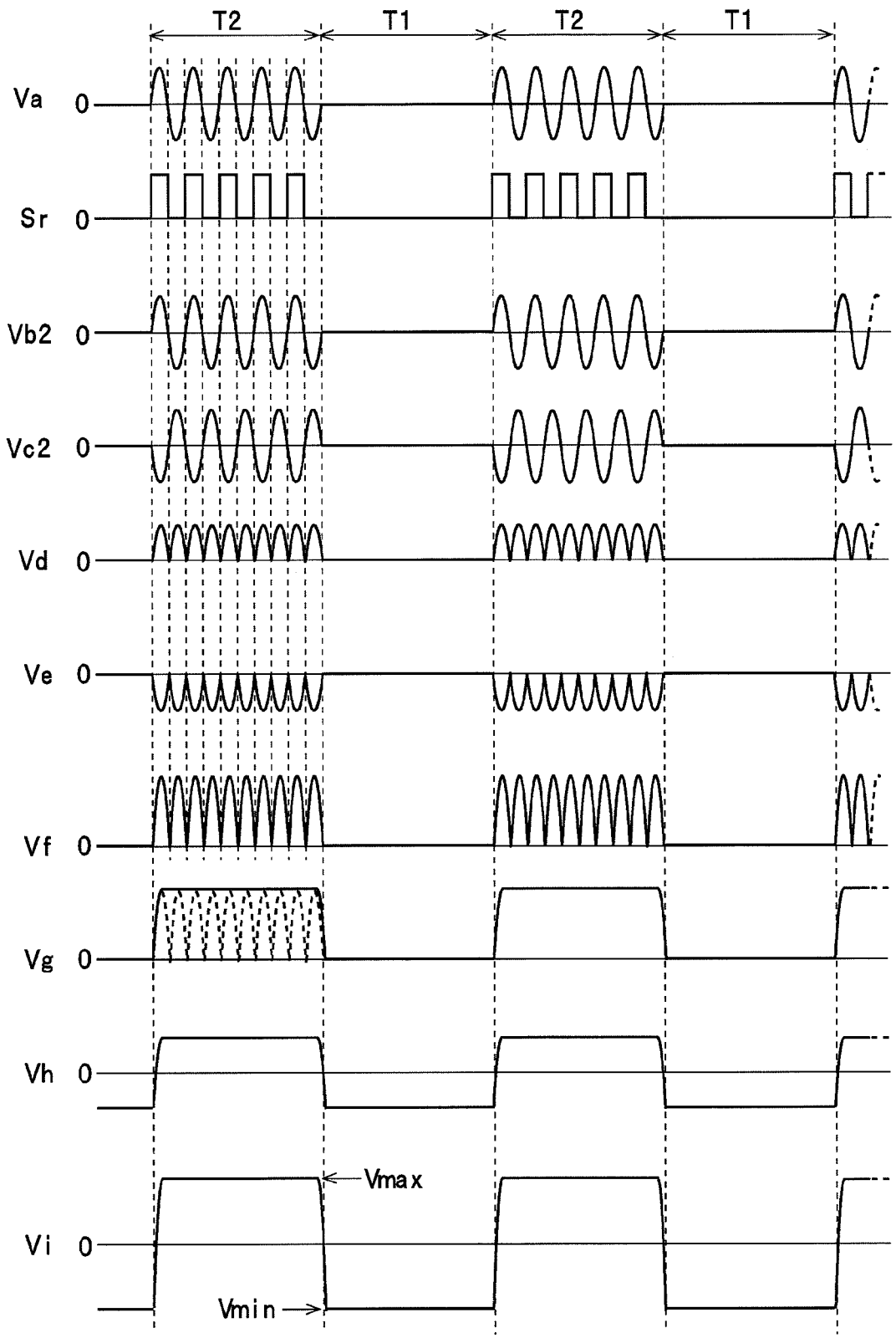
FIG. 16 is a waveform diagram useful in explaining the operation of a current measuring unit.

The LPF 203 is constructed of a low pass filter whose cut-off frequency fc1 is set at a slightly higher frequency than 1/(T1+T2). As one example, since T1 and T2 are both set at 0.5 seconds in the present embodiment, the cut-off frequency fc1 is set at 10 Hz that is slightly higher than 1 Hz. For this reason, the LPF 203 functions as an integrator for a difference signal Vf (a synchronous detection signal) with twice the frequency of the frequency f (in this example, 100 Hz) of the AC voltage Va, and as shown in FIG. 16, generates and outputs a voltage signal Vg that is similar to the envelope of the difference signal Vf. The HPF 204 is constructed of a high-pass filter whose cut-off frequency fc2 is set at a frequency that is sufficiently lower than 1/(T1+T2). In the present embodiment, as one example, the cut-off frequency fc2 is set at 0.1 Hz that is sufficiently lower than 1 Hz. For this reason, as shown in FIG. 16, the HPF 204 removes the DC component included in the voltage signal Vg and outputs the AC component of the voltage signal Vg as a voltage signal Vh. By using the construction described above, the LPF 203 and the HPF 204 function as a DC removal circuit and integrate the difference signal Vf and remove the DC component. The AC amplifier unit 205 includes an operational amplifier and is constructed as an AC amplifier circuit, receives an input of the voltage signal Vh, amplifies the voltage signal Vh by a predetermined gain, and outputs the result as a voltage signal Vi. The A/D converter unit 68 converts the voltage signal Vi to digital data and outputs the result as the current data Di. When doing so, the amplitude (as described later, Vmax−Vmin) of the voltage signal Vi shown by the current data Di is data showing the amplitude of the detection current I1. The amplitude of the AC current Ix flowing in the measured circuit 5 will be uniquely decided based on the amplitude of the detection current I1 and the specification of the detection clamp unit 21. It can therefore be said that the current measuring unit 42 measures the detection current I1 and also measures the AC current Ix flowing in the measured circuit 5.

Next, the resistance measuring process 100 carried out by the resistance measuring apparatus 201 will be described with reference to FIG. 4. Note that description of operations that are the same as those carried out by the resistance measuring apparatus 1 is omitted and only different operations will be described.

In the resistance measuring process 100, in the injection process in step 101, to cause the voltage injecting unit 41 to start generating the AC voltage Va, the processing unit 43 of the resistance measuring apparatus 201 starts outputting the triangular waveform generation data Ds for generating the triangular wave signal Ss to the voltage injecting unit 41 in synchronization with an internal clock with a sufficiently higher frequency than the reference clock CLK (the reference clock CLK is in synchronization with such internal clock). By doing so, in the voltage injecting unit 41, the triangular wave generating unit 202 starts generating and outputting the triangular wave signal Ss that is synchronized to the reference clock CLK and the LPF 52 converts the triangular wave signal Ss to the AC voltage Va. The power amplifier unit 53 amplifies the inputted AC voltage Va to generate the AC voltage V1 and applies the generated AC voltage V1 to the first coil 13 of the injection clamp unit 11. By doing so, the testing AC signal Vx (with the frequency f) is injected into the measured circuit 5 from the injection clamp unit 11, resulting in the AC current Ix with the frequency f flowing in the measured circuit 5.

In accordance with the start of the output of the triangular waveform generation data Ds to the voltage injecting unit 41, the processing unit 43 starts outputting the reference clock CLK to the reference signal generating unit 45. By doing so, the output process of the reference signal Sr by the reference signal generating unit 45 is commenced. That is, the supplying of the reference signal Sr (see FIG. 16) from the reference signal generating unit 45 to the switching units 63, 66 of the current measuring unit 42 is commenced.

In a state where the testing AC signal Vx with the frequency f is being intermittently injected into the measured circuit 5, the current measuring unit 42 carries out a process that detects the AC current Ix that is intermittently generated and generates the current data Di. More specifically, in the current measuring unit 42, first the detection clamp unit 21 detects the AC current Ix intermittently flowing in the measured circuit 5, the detection current I1 is outputted from the second coil 23, and the first and second amplifier units 61, 64 convert the detection current I1 to the first and second voltage signals Vb1, Vc1 and output the first and second voltage signals Vb1, Vc1. Next, in the current measuring unit 42, in the same way as in the resistance measuring apparatus 1, the positive-polarity signal Vd and the negative-polarity signal Ve are generated by the operations of the first and second BPFs 62, 65 and the switching units 63, 66.

Next, the third amplifier unit 67 calculates the difference between the positive-polarity signal Vd and the negative-polarity signal Ve to generate the difference signal (synchronous detection signal) Vf, the LPF 203 integrates the difference signal Vf and outputs the voltage signal Vg, and the HPF 204 removes the DC component from the voltage signal Vg and outputs the result as the voltage signal Vh. Here, based on the detection current I1 generated at both ends of the second coil 23, the first amplifier unit 61 and the second amplifier unit 64 that are connected to the respective ends of the second coil 23 output the first voltage signal Vb1 and the second voltage signal Vc1 that have respectively opposite phase, and the third amplifier unit 67 calculates the difference between the positive-polarity signal Vd and the negative-polarity signal Ve generated by the switching units 63, 66 based on the signals Vb1, Vc1 (in the present embodiment, the signals Vb2, Vc2 generated by the filtering processes by the BPFs 62, 65) and thereby generates the difference signal Vf. This means that even if common-mode noise is superimposed on the detection current I1, the third amplifier unit 67 will cancel such noise by carrying out the difference calculation.

Next, the AC amplifier unit 205 amplifies the voltage signal Vh to a suitable amplitude for the rated input of the A/D converter unit 68 and outputs the result as the voltage signal Vi. Here, when generating the voltage signal Vi, by using a construction where the voltage signal Vh is an AC signal and is AC amplified by the AC amplifier unit 205, unlike a construction that uses DC amplification, deterioration in the dynamic reserve is avoided and reduction in the noise tolerance is also avoided. In addition, since it is not necessary to use a costly operational amplifier with a small offset such as a DC amplifier, increases in the cost of the current measuring unit 42 and in turn of the resistance measuring apparatus 201 are avoided. After this, the A/D converter unit 68 converts the voltage signal Vi to digital data and outputs the digital data to the processing unit 43 as the current data Di.

Next, the processing unit 43 carries out a calculation process that calculates the resistance value Rx of the measured circuit 5 when the frequency is f (step 102). More specifically, in the calculation process, the processing unit 43 first calculates the amplitude of the detection current I1 based on the current data Di. Here, since the current data Di is waveform data of the voltage signal Vi in FIG. 16, the processing unit 43 recognizes the minimum value Vmin of the current data Di as the zero level and calculates the amplitude of the detection current I1 with a difference (Vmax−Vmin) between the maximum value Vmax and the minimum value Vmin of the waveform data as a value that corresponds to the amplitude of the detection current I1. The processing unit 43 also calculates the effective current of the detection current I1 from the calculated amplitude and the fact that the AC voltage V1 applied to the first coil 13 of the injection clamp unit 11 is a quasi-sinusoidal signal. After this, the effective voltage value of the testing AC signal Vx is calculated based on the effective voltage value of the AC voltage V1 and the number of turns (N1) in the first coil 13 and the current value of the AC current Ix (an effective current in the present embodiment) is calculated based on the effective current of the calculated detection current I1 and the number of turns (N2) in the second coil 23. Next, in the same way as in the resistance measuring apparatus 1, the processing unit 43 calculates the resistance value Rx of the measured circuit 5 when the frequency of the testing AC signal Vx is f based on the effective values of the testing AC signal Vx and the AC current Ix that have been calculated, and stores the calculated resistance value Rx in a memory so as to be associated with the frequency f. In the present embodiment, as one example, when calculating the resistance value Rx, the processing unit 43 calculates the resistance value Rx multiple times, calculates the average of such calculations (as one example, a moving average), and sets the average as the final resistance value Rx. By doing so, the calculation process of the resistance value Rx is completed. Finally, the processing unit 43 causes the output unit 44 to output the calculated resistance value Rx to the output unit 44 (step 103). By doing so, the resistance measuring process is completed.

In this way, in the resistance measuring apparatus 201, by intermittently applying the AC voltage V1 to the first coil 13, the voltage injecting unit 41 causes the testing AC signal Vx to be generated inside the measured circuit 5. Also, the reference signal generating unit 45 that includes the comparator 71 generates a binary signal that is synchronized to the AC voltage V1 and outputs such binary signal as the reference signal Sr. The current measuring unit 42 measures the detection current I1 (that is, the current value of the AC current Ix that is proportional to the current value of the detection current I1) by converting the detection current I1 flowing in the second coil 23 due to the injection of the testing AC signal Vx to the voltage signals Vb2, Vc2, subjecting the voltage signals Vb2, Vc2 to synchronous detection using the reference signal Sr to generate the difference signal Vf, integrating the difference signal Vf and removing the DC component, outputting the voltage signal Vh that is the AC component, and finally amplifying the voltage signal Vh.

Therefore, according to the resistance measuring apparatus 201, by AC amplifying the voltage signal Vh, which is required when measuring the detection current I1 (that is, when measuring the AC current Ix), as an AC signal using the AC amplifier unit 205, unlike a construction that uses DC amplification, it is possible to avoid deterioration in the dynamic reserve and to also avoid a reduction in the noise tolerance. In addition, since it is not necessary to use a costly operational amplifier with a small offset such as a DC amplifier when constructing the AC amplifier unit 205, it is possible to reduce the cost of the current measuring unit 42 and in turn the cost of the resistance measuring apparatus 201.

Also, according to the resistance measuring apparatus 201, by constructing the reference signal generating unit 45 so as to include the comparator 71, it is possible to reliably generate the binary signal from the AC voltage using a simple construction.

Note that the present invention is not limited to the construction described above. For example, although a construction has been described where the reference signal generating unit 45 that includes the comparator 71 and the DFF 72 generates the reference signal Sr based on the AC voltage V1 outputted from the power amplifier unit 53, it is also possible to use a construction where the reference signal generating unit 45 generates the reference signal Sr based on one of the triangular wave signal Ss outputted from the triangular wave generating unit 202 and the AC voltage (quasi-sinusoidal signal) Va outputted from the LPF 52. Also, although an example has been described where the reference signal generating unit 45 that generates the reference signal Sr is constructed using the comparator 71 so that the binary signal Sr0 can be reliably generated from the AC voltage V1 using a simple construction, the reference signal generating unit 45 is not limited to the comparator 71 and it is possible to use a variety of circuits that are able to compare an input value (the voltage value of the AC voltage V1) and a threshold (the comparison voltage Vref) and to output a result of such comparison (the binary signal Sr0).

Figure 15:
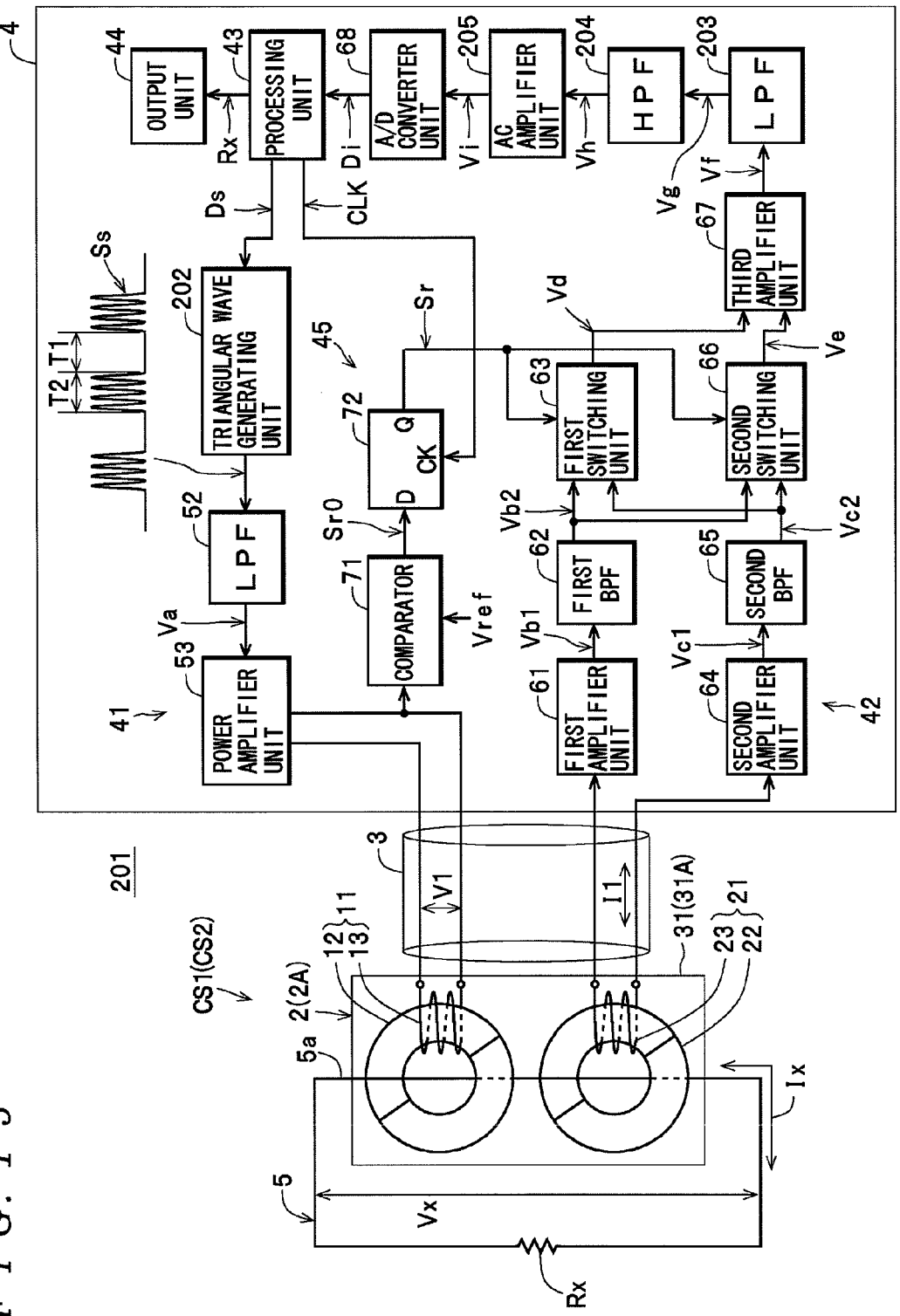
FIG. 15 is a block diagram showing the construction of a third resistance measuring apparatus.

Also, although a construction where the triangular wave generating unit 202 includes a D/A converter for example and the triangular wave signal Ss is intermittently generated and outputted based on the triangular waveform generation data Ds outputted from the processing unit 43 during fixed periods T2 at intervals of a fixed time interval T1 as shown in FIG. 15, it is also possible to construct the triangular wave generating unit 202 so as to include a D/A converter and a counter that counts up a count value in synchronization with the reference clock CLK, to operate the counter intermittently, and to convert the count value to an analog signal using the D/A converter and thereby generate the triangular wave signal Ss. It is also possible to use a construction where a DDS (not shown) is used in the triangular wave generating unit 202 to generate the triangular wave signal Ss.

Also, although a construction has been described where the triangular wave generating unit 202 and the reference signal generating unit 45 are provided separately to the processing unit 43, in the same way as the resistance measuring apparatus 1, the processing unit 43 may be constructed of a DSP that includes at least a CPU, an A/D converter, and a D/A converter. Also, with this construction, it is possible to construct the triangular wave generating unit 202 by causing the CPU to repeatedly carry out a count operation that is one of an up-count operation, a down-count operation, and an up/down-count operation in synchronization with the reference clock CLK and to output the count value to the D/A converter.

Figure 17:
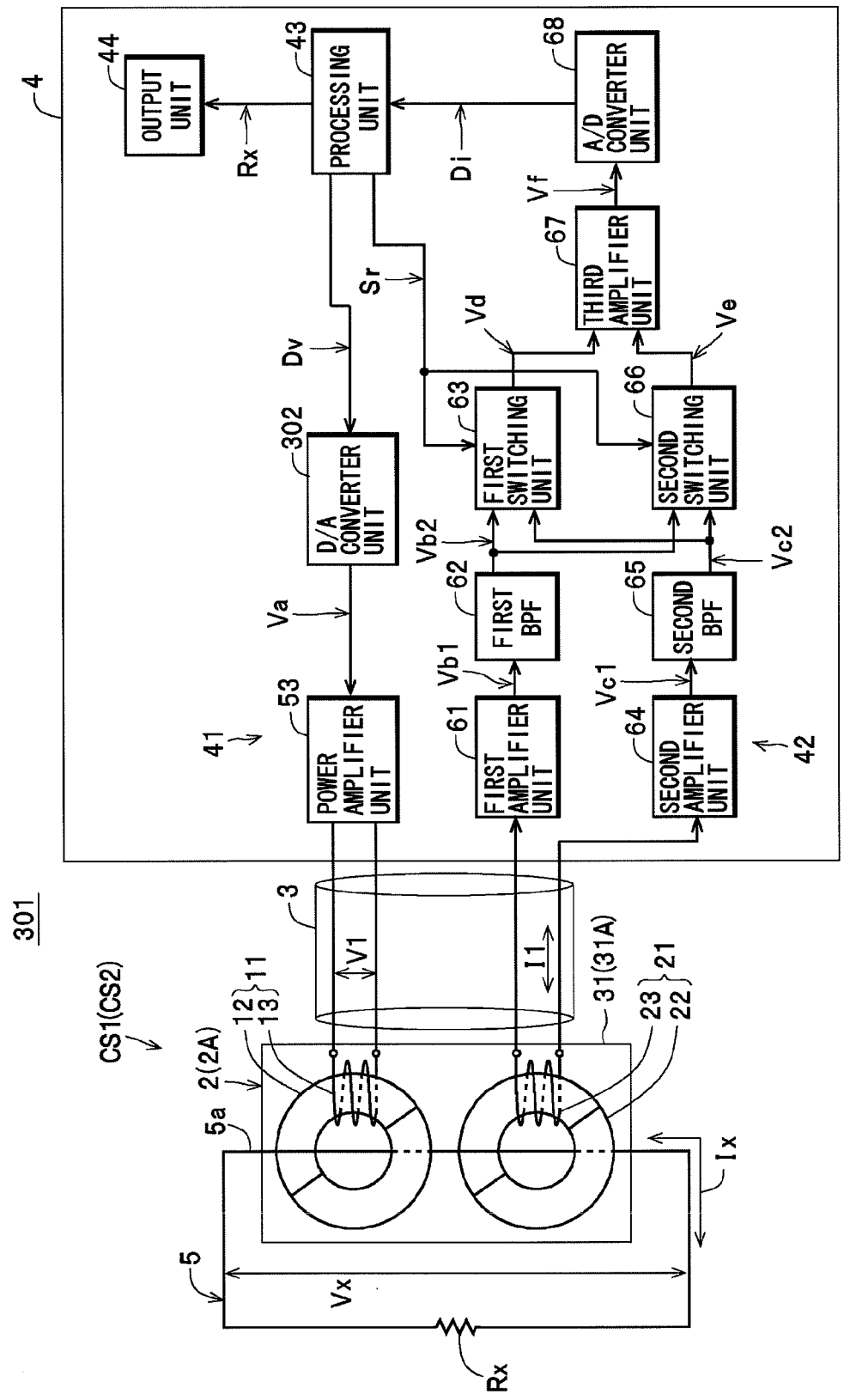
FIG. 17 is a block diagram showing the construction of a fourth resistance measuring apparatus.

Note that although a construction is described above where the reference signal generating unit 45 generates the reference signal Sr based on the AC voltage V1, like a fourth resistance measuring apparatus 301 shown in FIG. 17, it is also possible to use a construction where the processing unit 43 generates the reference signal Sr. The resistance measuring apparatus 301 will now be described below. Note that components that are the same as in the resistance measuring apparatus 1 described above have been assigned the same reference numerals and duplicated description thereof is omitted.

In the resistance measuring apparatus 301, the voltage injecting unit 41 includes a D/A converter unit 302, the power amplifier unit 53, and the injection clamp unit 11. The D/A converter unit 302 generates the AC voltage Va with a period T as shown in FIG. 3 based on AC waveform data (in the present embodiment, quasi-sinusoidal waveform data where the value cyclically changes with a fixed period T) Dv outputted from the processing unit 43. The power amplifier unit 53 amplifies the AC voltage Va to generate the AC voltage V1 with a voltage value (in the present embodiment, effective voltage value) set in advance and applies the AC voltage V1 to the first coil 13 of the injection clamp unit 11. Here, since the testing AC signal Vx injected into the measured circuit 5 is generated based on the AC voltage Va, the testing AC signal Vx will be synchronized to the AC voltage Va, that is, synchronized to the reference signal Sr.

In the current measuring unit 42 of the resistance measuring apparatus 301, the first switching unit 63 outputs the positive-polarity signal Vd in synchronization with the reference signal Sr outputted from the processing unit 43 and the second switching unit 66 outputs the negative-polarity signal Ve in synchronization with the reference signal Sr outputted from the processing unit 43.

Next, the resistance measuring process 100 carried out by the resistance measuring apparatus 301 will be described with reference to FIG. 4. Note that steps that carry out the same processing as the processing carried out by the resistance measuring apparatus 1 have been assigned the same reference numerals and duplicated description thereof is omitted.

In the resistance measuring apparatus 301, in the injection process carried out in step 101, the processing unit 43 starts outputting the AC waveform data Dv, which is used to generate the AC voltage Va with the frequency f, to the voltage injecting unit 41. By doing so, in the voltage injecting unit 41, the D/A converter unit 302 converts the AC waveform data Dv to the AC voltage (an analog signal) Va and outputs the AC voltage Va, and the power amplifier unit 53 amplifies the AC voltage Va to the AC voltage V1 and applies the AC voltage V1 to the first coil 13 of the injection clamp unit 11. At the same time as the start of output of the AC waveform data Dv, the processing unit 43 starts outputting the reference signal Sr whose frequency is set at f to the switching units 63, 66 in synchronization with the timing of cycles in the AC waveform data Dv. By doing so, the current measuring unit 42 operates in the same way as in the resistance measuring apparatus 1 described above to detect the AC current Ix and generate the current data Di. The processing unit 43 also carries out step 102 in the same way as in the resistance measuring apparatus 1 described above to calculate the resistance value Rx and then carries out step 103 in the same way to cause the output unit 44 to output the calculated resistance value Rx. Accordingly, the resistance measuring apparatus 301 can also achieve the same operational effects as the resistance measuring apparatus 1 and the like.

Figure 18:
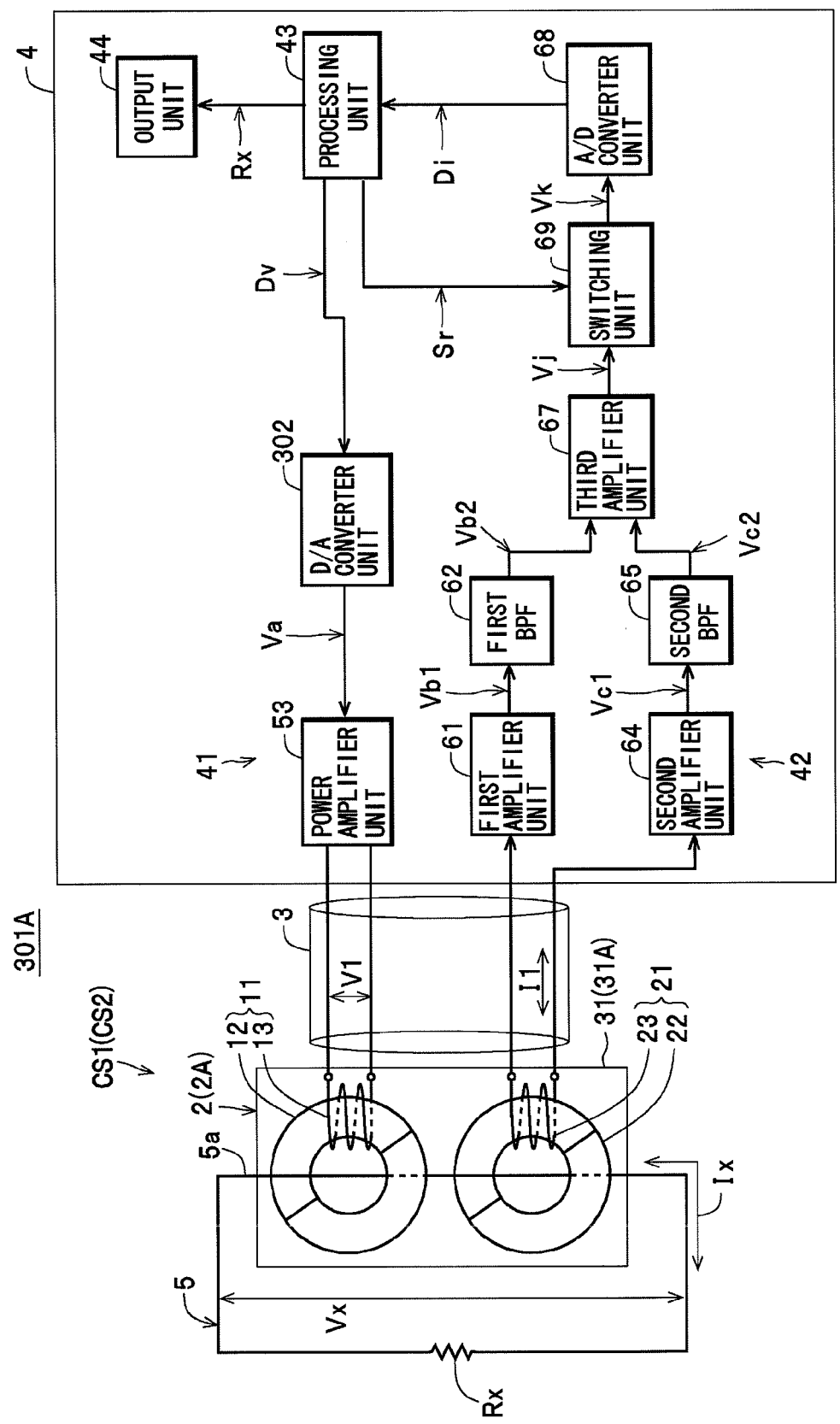
FIG. 18 is a block diagram showing the construction of another fourth resistance measuring apparatus.

Note that although the current measuring unit 42 is constructed so as to include the two switching units 63, 66 in the construction described above, it is also possible to apply the present invention to a construction where, like the current measuring unit 42 of a resistance measuring apparatus 301A shown in FIG. 18, a single switching unit 69 is included. The resistance measuring apparatus 301A will now be described with reference to FIGS. 18 to 20. Note that the resistance measuring apparatus 301A has the same construction as the resistance measuring apparatus 301 aside from the construction of the third amplifier unit 67 and the switching unit 69 of the current measuring unit 42. Accordingly, components that are the same have been assigned the same reference numerals, duplicated description thereof is omitted, and only the differences in the construction of the current measuring unit 42 will be described.

Figure 20:
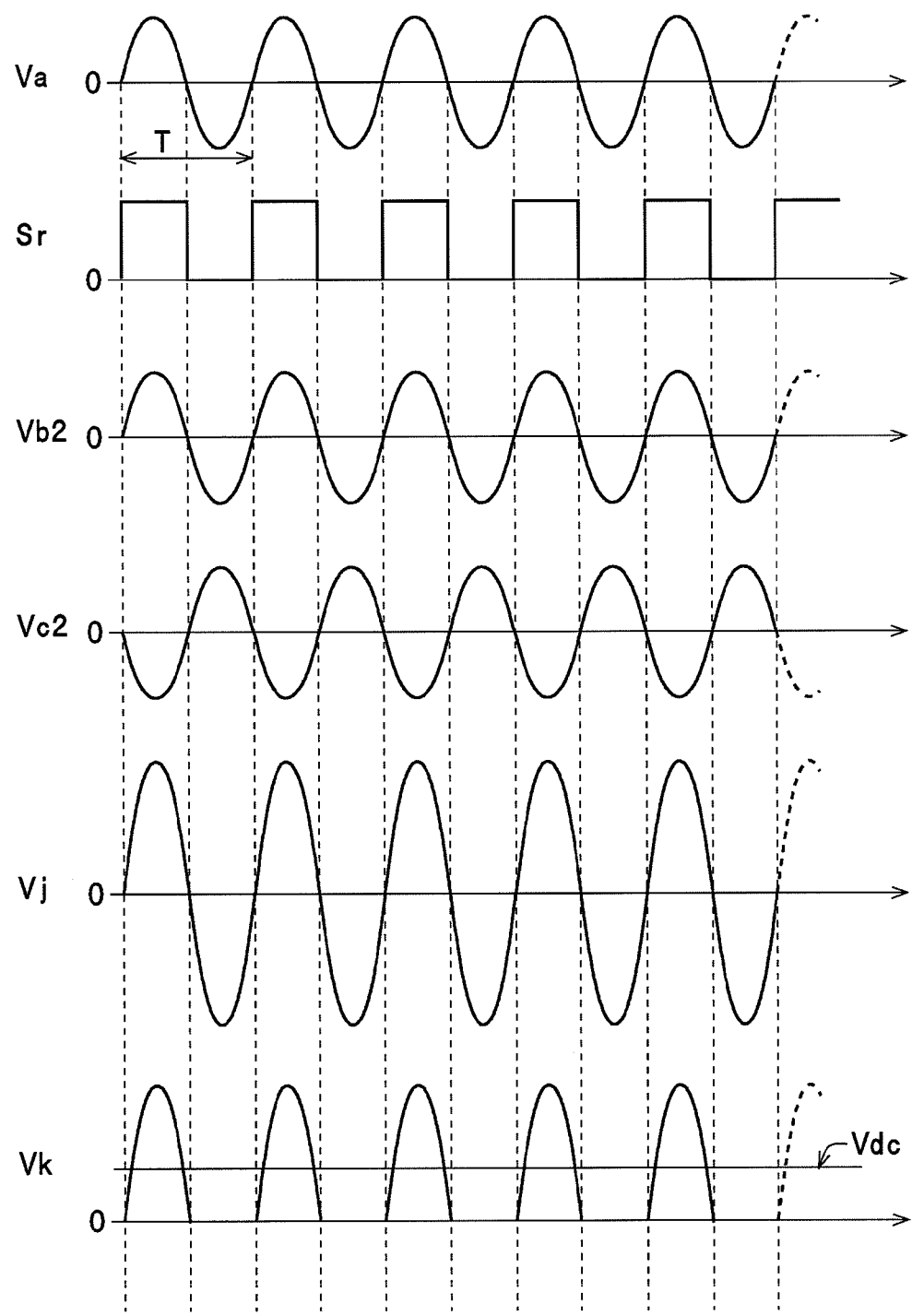
FIG. 20 is a waveform diagram useful in explaining the operation of the current measuring unit.

The current measuring unit 42 includes the detection clamp unit 21, the first amplifier unit 61, the first BPF 62, the second amplifier unit 64, the second BPF 65, the third amplifier unit 67, the switching unit 69, and the A/D converter unit 68. The third amplifier unit 67 receives an input of the first voltage signal Vb2 outputted from the first BPF 62 and the second voltage signal Vc2 outputted from the second BPF 65 and outputs a difference signal Vj between the signals Vb2, Vc2. In the present embodiment, as one example, as shown in FIG. 19, the third amplifier unit 67 is constructed as a differential amplifier unit in the same way as in the resistance measuring apparatus 1. With this construction, as shown in FIG. 20, the third amplifier unit 67 detects the difference between the first voltage signal Vb2 and the second voltage signal Vc2 and outputs the difference as the difference signal Vj. The difference signal Vj is an AC signal whose amplitude is proportional to the current value of the detection current I1.

The switching unit 69 is one example of an extraction unit and carries out synchronous detection on the difference signal Vj in synchronization with the reference signal Sr to extract and output a single-polarity signal Vk composed of only the positive-side part or the negative-side part of the waveform of the difference signal Vj (in the present embodiment, as one example only the positive-side part of the waveform as shown in FIG. 20). More specifically, the switching unit 69 is constructed of an analog switch, for example, and as shown in FIG. 20, by switching between the difference signal Vj and a reference voltage (ground potential) at half-cycle intervals in synchronization with the reference signal Sr outputted from the processing unit 43 (i.e., by carrying out a synchronous detection operation), outputs the single-polarity signal Vk that is a positive-polarity signal. The A/D converter unit 68 converts the single-polarity signal Vk to digital data and outputs the result as the current data Di. In this case, the current data Di is data showing the detection current I1.

Accordingly, in the resistance measuring apparatus 301A also, in the same way as in the resistance measuring apparatus 301, the processing unit 43 calculates the current value of the detection current I1 (in the present embodiment, the effective current) based on the current data Di, and then calculates the effective voltage value of the testing AC signal Vx based on the effective voltage value of the AC voltage V1 and the number of turns (N1) in the first coil 13 and calculates the current value (in the present embodiment, the effective current value) of the AC current Ix based on the calculated effective current value of the detection current I1 and the number of turns (N2) in the second coil 23. The processing unit 43 can therefore finally calculate the resistance value Rx of the measured circuit 5 based on the effective values of the testing AC signal Vx and the AC current Ix. In the same way as the resistance measuring apparatuses 1 to 301, since the resistance measuring apparatus 301A avoids the use of a single-ended second coil 23 and the use of a shunt resistor, it is possible to achieve favorable frequency characteristics while maintaining a sufficient detection gain. Also, since the third amplifier unit 67 is constructed to calculate and output the difference signal Vj between the first voltage signal Vb2 outputted from the first BPF 62 and the second voltage signal Vc2 outputted from the second BPF 65, even if common-mode noise is superimposed on the detection current I1, it will be possible to cancel the common-mode noise in the difference calculation carried out by the third amplifier unit 67. Also, since the switching unit 69 carries out synchronous detection on the difference signal Vj, even if normal-mode noise is included in the detection current I1, such normal-mode noise can be removed.

Also, in addition to the construction described above, it is also possible to construct the resistance measuring apparatus with a function that automatically cancels any offset produced in the amplifier circuit. Fifth recording apparatuses 401, 401A equipped with such function will now be described with reference to FIGS. 21 to 25.

First, the resistance measuring apparatus 401 will be described. Note that since the resistance measuring apparatus 401 is similar to the resistance measuring apparatus 301, components that are the same as in the resistance measuring apparatus 301 have been assigned the same reference numerals, duplicated description is omitted, and the description will focus on the differences in construction.

In the resistance measuring apparatus 401, the current measuring unit 42 (hereinafter also referred to as the "current detecting unit 42") includes the detection clamp unit 21, the first amplifier unit 61, the first BPF 62, the first switching unit 63, the second amplifier unit 64, the second BPF 65, the second switching unit 66, the third amplifier unit (hereinafter also referred to as a "differential amplifier unit") 67, a low pass filter (hereinafter, simply "LPF") 403, a DC amplifier unit 404, and the A/D converter unit 68, and is constructed so as to be capable of detecting the AC current Ix using the detection clamp unit 21 and measuring the current value of the AC current Ix. The LPF 403 removes most of the AC component included in the difference signal Vf and selectively passes the DC component Vdc (see FIG. 3). The DC amplifier unit 404 amplifies a DC component Vdc by a predetermined gain and outputs the result as a DC voltage Vdc1. Since the signal amplified by the DC amplifier unit 404 is the DC component Vdc, unlike the differential amplifier unit 67, the DC amplifier unit 404 is not constructed as a broadband amplifier and is instead constructed as a narrowband amplifier that amplifies mainly the DC component. The A/D converter unit 68 converts the DC voltage Vdc1 to digital data and outputs the result as the current data Di. Accordingly, the current data Di outputted from the A/D converter unit 68 is data that is proportional to the current value of the detection current I1 and by multiplying the current data Di by the number of turns (N2) in the second coil 23 and dividing the multiplication result by the amplification gains of the differential amplifier unit 67 and the DC amplifier unit 404, the AC current Ix that flows in the measured circuit 5 is calculated.

The processing unit 43 is constructed of a CPU and a memory and carries out an offset updating process and a resistance measuring process. The memory is constructed of a RAM or the like and corresponds to a "storage unit" for the present invention. An initial value of the offset current Ioff used in the resistance measuring process and a resistance threshold Rth used in the offset updating process are stored in advance in the memory. Note that it is possible to use a construction where the initial value of the offset current Ioff is stored in a memory during the manufacturing of the resistance measuring apparatus 1, or to use a construction where the initial value of the offset current Ioff is not stored during the manufacturing of the resistance measuring apparatus 1 and the processing unit 43 stores the current data Di outputted from the A/D converter unit 68 when the power is turned on in the memory as the initial value of the offset current Ioff. The memory is constructed so as to be capable of storing a plurality (in the present embodiment, five) of the most recent values of the resistance value Rx calculated by the processing unit 43 in the resistance measuring process.

The resistance threshold Rth is a condition used to judge whether the offset current Ioff is to be updated during the offset updating process. The updating of the offset current Ioff is carried out when the clamp unit 2 is physically closed but is not clamping anything or when the clamp unit 2 is clamping a wire but such wire is in an open state (i.e., the wire does not form part of a closed circuit). Both states are hereinafter collectively referred to as the "open state". To have the offset current Ioff updated when the resistance measuring apparatus is in a state close to the open state, the resistance threshold Rth is set at a value that is smaller than the resistance value Rx calculated by the processing unit 43 in the open state and larger than a maximum value Rmax (for example, 1600Ω when the measurement range is 0Ω to 1600Ω inclusive) of the measurement range of the resistance measuring apparatus 1 (preferably a value that greatly exceeds the maximum value Rmax, such as around twice the maximum value Rmax or higher, in the present embodiment, 3000Ω). Note that a value that greatly exceeds the maximum value Rmax is used as the resistance threshold Rth to have the offset current Ioff updated in a state that is closer to the open state described above (i.e., a state that is similar to the open state).

Figure 22:
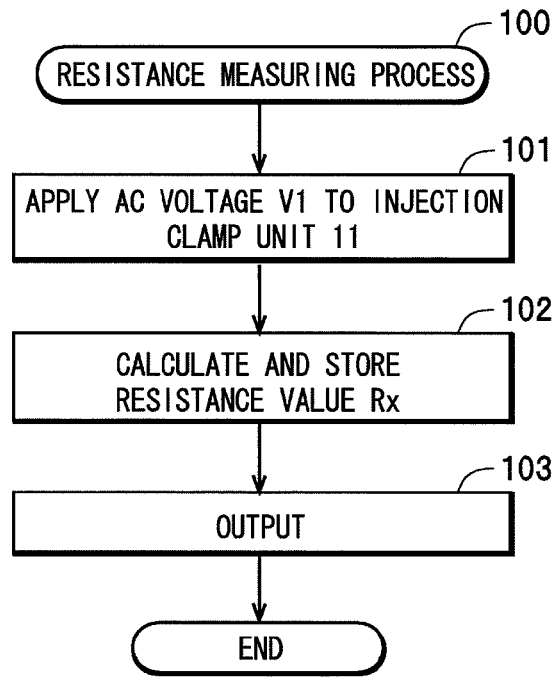
FIG. 22 is a flowchart useful in explaining a resistance measuring process carried out by the fifth resistance measuring apparatus.

Next, the resistance measuring process 100 carried out by the resistance measuring apparatus 401 will be described with reference to FIG. 22. Note that the processing unit 43 repeatedly carries out the resistance measuring process 100 with a predetermined cycle (for example, with a period of several seconds to ten-odd seconds).

In the resistance measuring process 100, the processing unit 43 first starts an applying process that applies the AC voltage V1 with a predetermined frequency f to the injection clamp unit 11 (step 101). More specifically, in the applying process, the processing unit 43 starts outputting the AC waveform data Dv to the voltage injecting unit 41 to cause the voltage injecting unit 41 to generate the AC voltage Va with the frequency f. By doing so, in the voltage injecting unit 41, the D/A converter unit 302 converts the AC waveform data Dv to the AC voltage (analog signal) Va and outputs the AC voltage Va, and the power amplifier unit 53 amplifies the AC voltage Va to the AC voltage V1 and applies the AC voltage V1 to the first coil 13 of the injection clamp unit 11.

By doing so, in a state where the injection clamp unit 11 is clamping the wire 5a of the measured circuit 5, the testing AC signal Vx (with the frequency f) is injected into the measured circuit 5 from the injection clamp unit 11. For this reason, due to the injection of the testing AC signal Vx, the AC current Ix with the frequency f flows in the measured circuit 5. At the same time as the start of output of the AC waveform data Dv, the processing unit 43 synchronizes with the timing of cycles in the AC waveform data Dv and starts outputting the reference signal Sr whose frequency is set at f to the switching units 63, 66.

In the state where the testing AC signal Vx with the frequency f is being injected into the measured circuit 5, the current detecting unit 42 detects the AC current Ix and generates the current data Di. More specifically, in the current detecting unit 42, the detection clamp unit 21 detects the AC current Ix flowing in the measured circuit 5, outputs the detection current I1 from the second coil 23, and the first and second amplifier units 61, 64 convert the detection current I1 to the first and second voltage signals Vb1, Vc1 and output the first and second voltage signals Vb1, Vc1.

Next, the first and second BPFs 62, 65 remove the harmonic components included in the corresponding voltage signals Vb1, Vc1 and output the resulting signals as the first and second voltage signals Vb2, Vc2, and the switching units 63, 66 switch between the first and second voltage signals Vb2, Vc2 in synchronization with the reference signal Sr to generate and output the positive-polarity signal Vd and the negative-polarity signal Ve.

After this, the differential amplifier unit 67 calculates the difference between the positive-polarity signal Vd and the negative-polarity signal Ve, amplifies the result, and outputs the amplified signal as the difference signal Vf. Next, the LPF 403 selectively passes the DC component Vdc included in the difference signal Vf and the DC amplifier unit 404 amplifies the DC component Vdc and outputs the result as the DC voltage Vdc1. Finally, the A/D converter unit 68 converts the DC voltage Vdc1 to digital data and outputs the result to the processing unit 43 as the current data Di. Here, in the current detecting unit 42, the first amplifier unit 61 and the second amplifier unit 64 connected to the respective ends of the second coil 23 output the first voltage signal Vb1 and the second voltage signal Vc1 that have respectively opposite phase based on the detection current I1 generated at the ends of the second coil 23 to which the first amplifier unit 61 and the second amplifier unit 64 are connected, and the differential amplifier unit 67 calculates the difference between the positive-polarity signal Vd and the negative-polarity signal Ve generated by the switching units 63, 66 based on the signals Vb1, Vc1 and thereby generates the difference signal Vf. This means that even if common-mode noise is superimposed on the detection current I1, by carrying out the difference calculation, the differential amplifier unit 67 cancels such noise. Accordingly, the current data Di includes only data on the detection current I1 that has been amplified and the offset current Ioff generated by the current detecting unit 42.

Next, the processing unit 43 carries out a calculation/storage process for the resistance value Rx of the measured circuit 5 (step 102). In this calculation/storage process, the processing unit 43 first carries out a calculation process that calculates a real current value (the current actually flowing in the second coil 23, in the present embodiment the effective current) I1re of the detection current I1 based on the current data Di. More specifically, the processing unit 43 first calculates a current value (effective value) I1e of the detection current I1 based on the current data Di and the respective gains of the differential amplifier unit 67 and the DC amplifier unit 404. Next, by subtracting the offset current Ioff stored in the memory from the current value I1e of the detection current I1, the processing unit 43 calculates the real current value I1re (=I1e−Ioff) for the detection current I1.

Next, the processing unit 43 calculates the effective voltage Vxe of the testing AC signal Vx based on the effective voltage value of the AC voltage V1 and the number of turns (N1) in the first coil 13 and calculates the current value (in the present embodiment, the effective current Ixe(=N2×I1re) of the AC current Ix based on the calculated real current value I1re of the detection current I1 and the number of turns (N2) in the second coil 23. Next, the processing unit 43 calculates the resistance value Rx (=Vxe/Ixe) of the measured circuit 5 when the frequency of the AC voltage V1 is f based on the calculated effective values Vxe, Ixe of the testing AC signal Vx and the AC current Ix and stores the calculated resistance value Rx together with the parameter (the current value I1e of the detection current I1) used when calculating the resistance value Rx in the memory. As described above, the processing unit 43 repeatedly carries out the resistance measuring process 100 with a predetermined cycle and stores a number (in the present embodiment, five) of the most recently calculated resistance values Rx in the memory. By doing so, the calculation/storage process for the resistance value Rx is completed.

Finally, the processing unit 43 outputs the most recently calculated resistance value Rx to the output unit 44 (step 103). Here, when the most recent resistance value Rx is within the measurement range, the processing unit 43 causes the output unit 44 to display the resistance value Rx. On the other hand, when the resistance value Rx exceeds the measurement range, the processing unit 43 has the characters "O.F" displayed in place of the calculated resistance value Rx. When the resistance value Rx is below the measurement range (i.e., when the value is negative), the processing unit 43 has the number "0" displayed in place of the calculated resistance value Rx. By doing so, the resistance measuring process 100 is completed. Note that in a state where the injection clamp unit 11 is not clamping the wire 5*a* of the measured circuit 5 or where the wire 5*a* is clamped but the measured circuit 5 is in the open state, the AC current Ix will not flow in the wire 5*a* and therefore the detection current I1 outputted from the second coil 23 of the detection clamp unit 21 will be substantially zero. Accordingly, since the current data Di outputted from the current detecting unit 42 is data on only the offset current value Ioff generated by the current detecting unit 42, the calculated resistance value Rx will have the value infinity.

Next, an offset updating process 110 will be described with reference to FIG. 23. In the present embodiment, as one example, the processing unit 43 carries out the offset updating process 110 every time a new resistance value Rx is calculated.

In the offset updating process 110, the processing unit 43 first reads a plurality of resistance values Rx that are stored in the memory (step 111) and then carries out a comparison process on the resistance values Rx (step 112). In this comparison process, the processing unit 43 reads out the resistance threshold Rth that is also stored in the memory and compares all of the resistance values Rx that have just been read to the resistance threshold Rth. The processing unit 43 also compares the respective resistance values Rx to the value "0" (to determine whether the respective resistance values Rx are negative).

When, as a result of the comparison process, all of the resistance values Rx satisfy an "offset updating possible" condition, that is, when there is an "offset updating possible state" where all of the resistance values Rx are equal to or larger than the resistance threshold Rth or an "offset updating possible state" where all of the resistance values Rx are negative, the processing unit 43 updates the offset value (step 113). More specifically, the processing unit 43 reads a current value I1e of the detection current I1 stored in the memory corresponding to the most recent resistance value Rx and updates the offset current value Ioff stored in the memory to such current value I1e to set a new offset current value Ioff (i.e., the processing unit 43 overwrites the offset current value Ioff in the memory), thereby completing the offset updating process 110. On the other hand, when the result of the comparison process in step 112 is that the offset updating possible state is not present (i.e., when all of the resistance values Rx read from the memory are positive and at least one resistance value Rx is below the resistance threshold Rth), the processing unit 43 completes the offset updating process 110 without proceeding to step 113.

As described above, every time a new resistance value Rx is measured, the processing unit 43 carries out the offset updating process 110 and when all of the resistance values Rx stored in the memory are in the offset updating possible state described above, that is, when every resistance value Rx during a period where a plurality of resistance values Rx are calculated are stable in one out of the two offset updating possible states described above (or in other words, when the current value I1e of the detection current I1 used to calculate the resistance value Rx is stable), the current value I1e is stored as an updated offset current value Ioff. This means that in the resistance measuring apparatus 1, a resistance value Rx with a correct value will always be calculated using the most recent offset current value Ioff.

In this way, according to the resistance measuring apparatus 401, since the processing unit 43 carries out the offset updating process to update the offset current value Ioff stored in the memory to the current value I1e of the detection current I1 flowing in the second coil 23 of the detection clamp unit 21 when the calculated resistance value Rx is in an offset updating possible state where the value has become equal to or larger than the resistance threshold Rth or has become negative, the resistance value Rx will always be calculated using the most recent offset current value Ioff. As a result, even in conditions where an offset is produced due to changes in environmental conditions such as temperature and humidity (fluctuations in the usage environment) and/or changes over time in the electronic components that construct the amplifier units of the current detecting unit 42, it will always be possible to measure the resistance value Rx with high precision.

Also, according to the resistance measuring apparatus 401, since it is possible to update the offset current value Ioff using the current value I1e when all of the resistance values Rx stored in the memory are in the offset updating possible state, that is, when every resistance value Rx during a certain period where a plurality of resistance values Rx are calculated is stable in one of the two offset updating possible states (i.e., when the offset updating possible state continues for a predetermined time or longer), or in other words, when the current value I1e of the detection current I1 used to calculate the resistance value Rx is stable, it will be possible to avoid having the offset current value Ioff updated when the current value I1e is not stable, and as a result, it is possible to sufficiently improve the reliability of the measured resistance value Rx.

Note that although a construction where the resistance threshold Rth is provided for the resistance values Rx to judge whether the values are in the offset updating possible state is used in the resistance measuring apparatus 401, since the current value (effective value) I1e of the detection current I1 flowing in the second coil 23 of the detection clamp unit 21 and the resistance value Rx are related (in an inversely proportional relationship), it is also possible to use a construction that judges whether the offset updating possible state is present based on the current value I1e of the detection current I1, that is, an equivalent construction to the construction described above.

Figure 23:
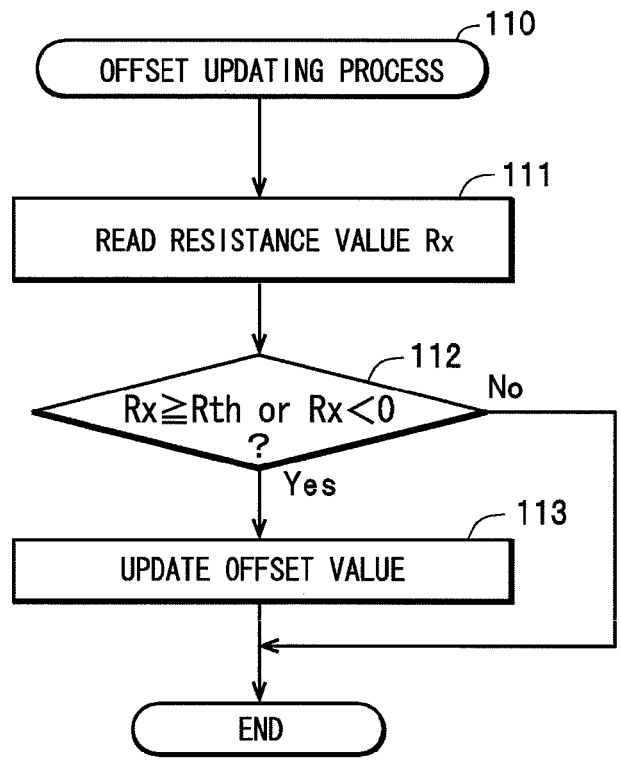
FIG. 23 is a flowchart useful in explaining an offset updating process carried out by the fifth resistance measuring apparatus.

More specifically, a current value I1e of the detection current I1 at a point where the resistance value Rx calculated based on the current value I1e matches the resistance threshold Rth is stored in advance in the memory as a current threshold Ith, and in place of reading the resistance value Rx in step 111 of the offset updating process 110 shown in FIG. 23, the processing unit 43 reads the current value I1e of the detection current I1, judges whether the read current value I1e is equal to or below the current threshold Ith in step 112, and updates the offset value in step 113 when the current value I1e is equal to or below the current threshold Ith (i.e., the offset updating possible state is present).

With this construction also, in the same way as the construction that uses the resistance threshold Rth, it is always possible to calculate the resistance value Rx using the most recent offset current value Ioff, and therefore even in conditions where the usage environment varies and/or the electronic components change over time, it will always be possible to measure the resistance value Rx with high precision.

Figure 24:
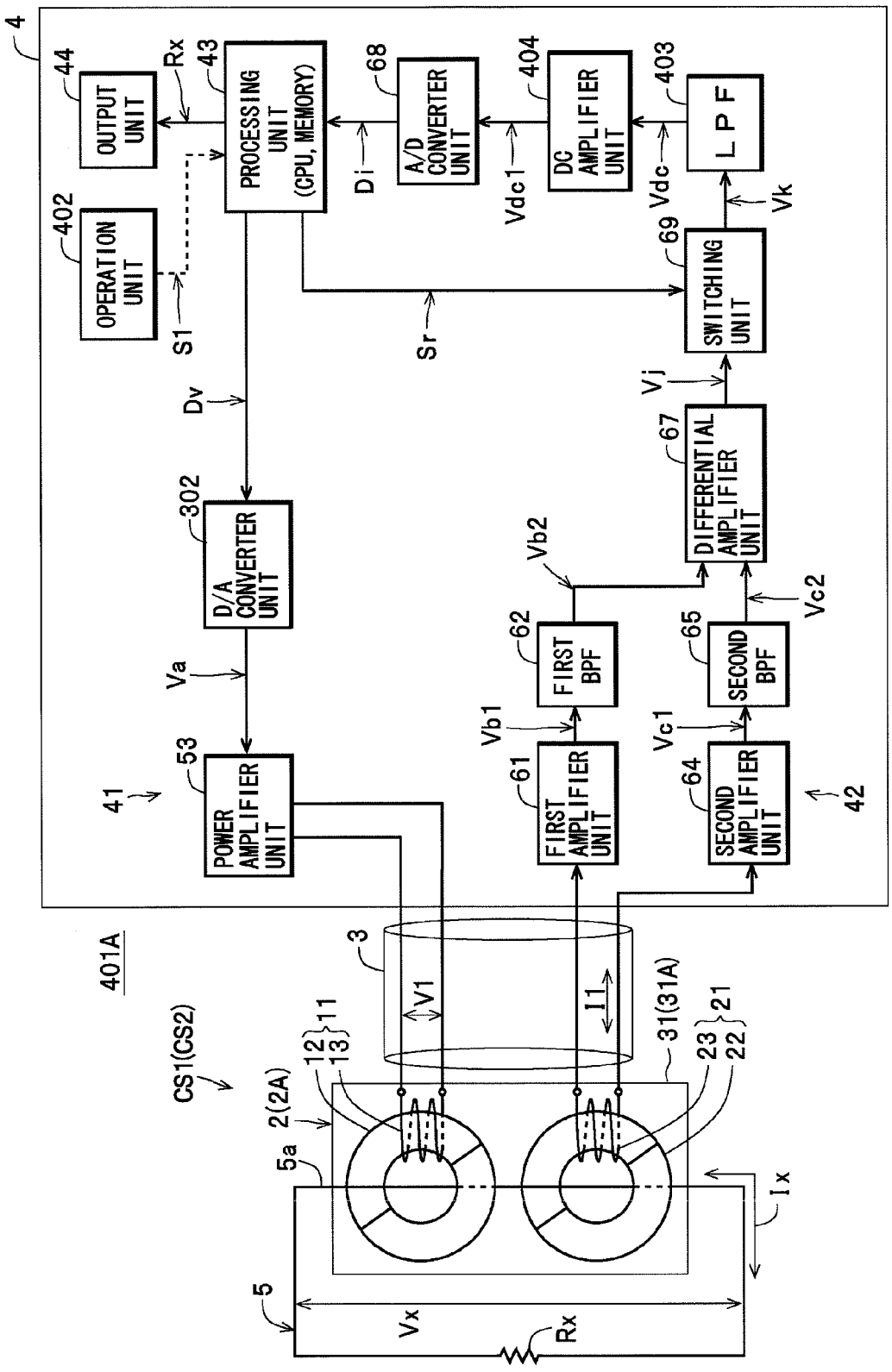
FIG. 24 is a block diagram showing the construction of another fifth resistance measuring apparatus.

Also, although the resistance measuring apparatus 401 described is constructed so that the current detecting unit 42 includes the two switching units 63, 66, it is also possible to use a construction where one switching unit 69 is included as in the current measuring unit 42 of the resistance measuring apparatus 301A described above (see FIG. 18) and thereby construct a resistance measuring apparatus 401A such as that shown in FIG. 24. The resistance measuring apparatus 401A will now be described with reference to FIGS. 24 and 25. Note that since the resistance measuring apparatus 401A has the same construction as the resistance measuring apparatus 401 aside from the construction of the current detecting unit 42 and the current detecting unit 42 has the same construction as the current detecting unit 42 of the resistance measuring apparatus 301A, components that are the same have been assigned the same reference numerals, duplicated description thereof is omitted, and only the operation of the resistance measuring apparatus 401A will be described.

In the resistance measuring apparatus 401A also, in the same way as the resistance measuring apparatus 401, the processing unit 43 first calculates the current value I1e of the detection current I1 based on the current data Di and the like, subtracts the offset current value Ioff from the current value I1e to calculate the real current value I1re for the detection current I1, then calculates the effective voltage Vxe of the testing AC signal Vx based on the effective voltage value of the AC voltage V1 and the number of turns (N1) in the first coil 13. The processing unit 43 also calculates the current value (in the present embodiment, the effective current value (Ixe(=N2×I1re)) of the AC current Ix based on the calculated real current value I1re of the detection current I1 and the number of turns (N2) in the second coil 23, and finally calculates the resistance value Rx (=Vxe/Ixe) of the measured circuit 5 based on the calculated effective values Vxe, Ixe of the testing AC signal Vx and the AC current Ix. Therefore, according to the resistance measuring apparatus 401A also, in the same way as the resistance measuring apparatus 401, by using the resistance threshold Rth or the current threshold Ith, it is possible to update the offset current value Ioff using the current value I1e of the detection current I1, and to always calculate the resistance value Rx using the most recent offset current value Ioff. As a result, even in conditions where the usage environment varies and/or the electronic components change over time, it will still be possible to always measure the resistance value Rx with high precision.

Figure 21:
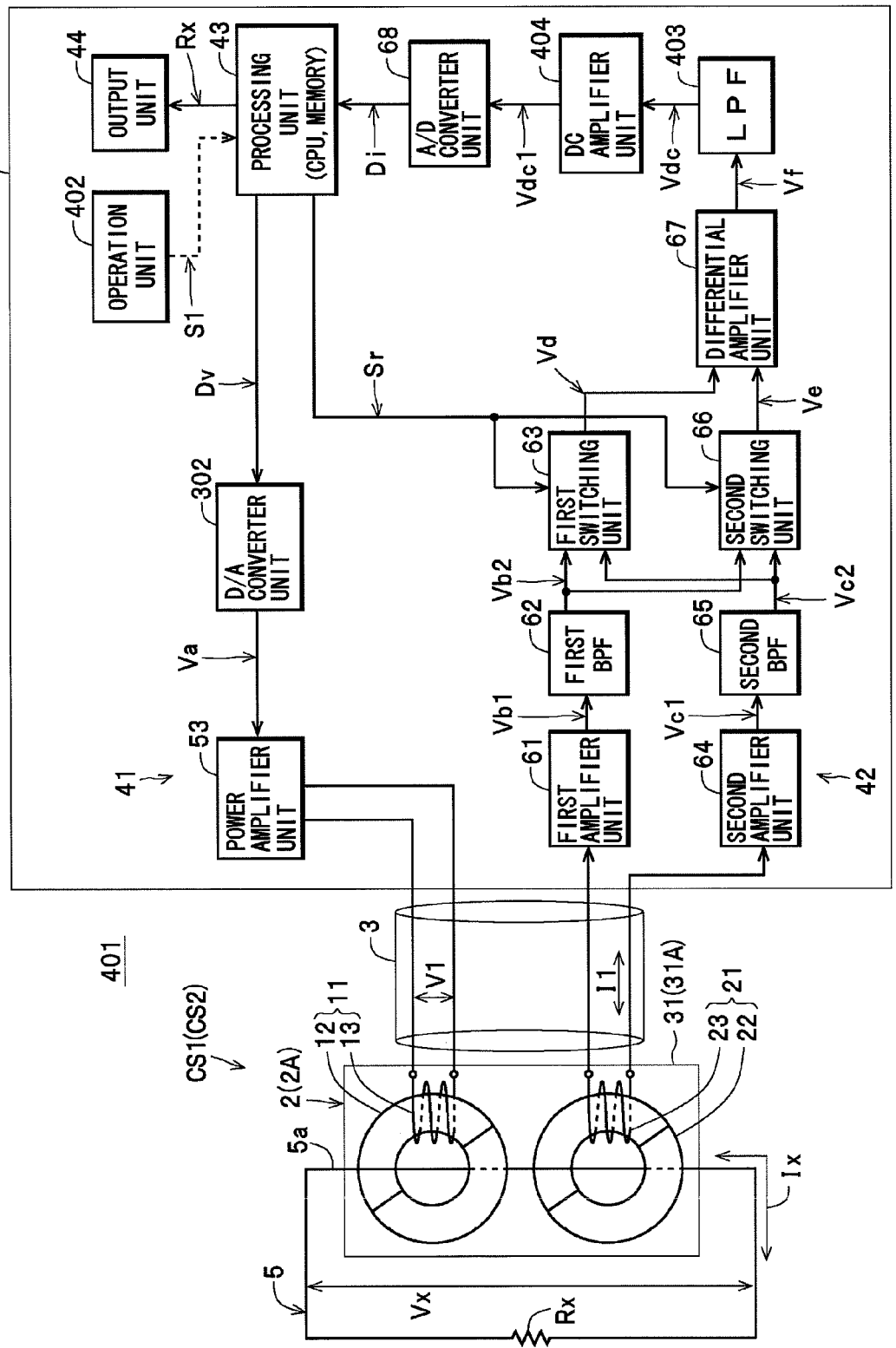
FIG. 21 is a block diagram showing the construction of a fifth resistance measuring apparatus.

Also, although the resistance measuring apparatuses 401, 401A described above use a construction where the processing unit 43 makes a judgment on whether the offset updating possible state is present (i.e., whether each resistance value Rx is equal to or higher than the resistance threshold Rth or a negative value) and always updates the offset value when the offset updating possible state is present, as shown in FIGS. 21 and 24, it is also possible to use a construction that includes an operation unit 402 that generates an updating signal S1 in accordance with an operation content and outputs the updating signal S1 to the processing unit 43 so that the offset value can be updated when desired by the operator by operating the operation unit 402. An offset updating process 120 carried out by this construction will now be described with reference to FIG. 25. Note that since the offset updating process 120 differs to the offset updating process 110 in FIG. 23 only by including step 121, steps that are the same as in the offset updating process 110 have been assigned the same reference numerals and detailed description thereof is omitted.

In the offset updating process 120, the processing unit 43 first determines whether the updating signal S1 has been inputted from the operation unit 402 (step 121), and when the updating signal S1 has not been inputted, the offset updating process 120 is completed. On the other hand, in step 121, when the updating signal S1 has been inputted from the operation unit 402, in the same way as in the offset updating process 110, steps 111 to 113 are carried out, and when every resistance value Rx is in the offset updating possible state, the current value I1e of the detection current I1 stored in the memory in association with the most recent resistance value Rx is read out, and the offset current value Ioff stored in the memory as the most recent offset current value Ioff is updated to the current value I1e, thereby completing the offset updating process 120. According to the resistance measuring apparatus 401, 401A of this construction, the offset current value Ioff can be updated only when the operator has operated the operation unit 402 to output the updating signal S1, or in other words, the offset current value Ioff can be updated at the timing desired by the operator.

Also, in the resistance measuring apparatuses 401, 401A, since the construction of the current measuring unit (the current detecting unit) 42 up to the generation (extraction) of the difference signal Vf as the detection output signal and the single-polarity signal Vk is the same as in the resistance measuring apparatuses 1 to 301A described above, it is possible to avoid the use of a single-ended second coil 23 and the use of a shunt resistor. This means it is possible to achieve the same operational effects as the resistance measuring apparatuses 1 to 301A described above, such as to achieve favorable frequency characteristics while maintaining a sufficient detection gain.

Also, for example, although the capacitors 61e, 64e are respectively disposed so as to come after the operational amplifiers 61a, 64a in the resistance measuring apparatuses 1, 1A, 201, 301, 301A, 401, and 401A described above, when the offset voltages of the operational amplifiers 61a, 64a are extremely small, it is also possible to use a construction where the capacitors 61e, 64e are not provided. With this construction, the resistors 61d, 64d can also be eliminated. Also, although constructions that use the first and second BPFs 62, 65 to improve the measurement precision of the resistance value Rx have been described above, when the required measurement precision can be achieved, it is also possible to use a construction where the first and second BPFs 62, 65 are not provided.

Although a construction that uses the switching units 63, 66 and the switching unit 69 has been described above as one example of a construction (extraction unit construction) where the difference signal Vf as a detection output signal and the single-polarity signal Vk are generated (extracted) by carrying out synchronous detection on the first voltage signal Vb2 and the second voltage signal Vc2 using the reference signal Sr, it is also possible to use a construction that carries out synchronous detection using a multiplier. Also, although an example where the resistance value Rx is calculated based on an effective voltage as the voltage value of the testing AC signal Vx and an effective current as the current value of the AC current Ix has been described above, the voltage is not limited to an effective voltage value and the current is similarly not limited to an effective current value. More specifically, it is possible to use a construction that calculates the resistance value Rx based on an average voltage as the voltage value of the testing AC signal Vx and an average current as the current value of the AC current Ix, a construction that calculates the resistance value Rx based on a peak-to-peak value (voltage amplitude) as the voltage value of the testing AC signal Vx and a peak-to-peak value (current amplitude) as the current value of the AC current Ix, and a construction that calculates the resistance value Rx based on a peak voltage as the voltage value of the testing AC signal Vx and a peak current as the current value of the AC current Ix.

What is claimed is:

1. A resistance measuring apparatus, comprising:
a voltage injector that injects a testing AC signal into a measured circuit by applying an AC voltage to an injection coil;
a current measurer that detects and measures an AC current, which is flowing in the measured circuit due to injection of the testing AC signal, using a detection coil;
a processor that calculates a resistance value of the measured circuit based on a voltage value of the injected testing AC signal and a measured value of the AC current; and
a single clamp-type housing that houses the injection coil and the detection coil,
wherein:
the voltage injector applies a signal that is synchronized to a reference signal as the AC voltage,
the current measurer converts a current flowing in the detection coil due to the injection of the testing AC signal to a voltage signal, carries out synchronous detection on the voltage signal using the reference signal, and measures a current value of the AC current based on a signal obtained by the synchronous detection,
the single clamp-type housing includes a first housing and a second housing that respectively house the injection coil and the detection coil,
the first housing and the second housing each has a three-piece structure divided in three separate parts in a thickness direction thereof, the three parts including a middle housing and a pair of side housings that are disposed in the thickness direction,
the middle housing includes a first plate-shaped member formed with the same planar shape as a planar shape of a corresponding one of the first housing and the second housing, a first wall portion that is positioned on one surface of the first plate-shaped member along an outer edge of the first plate-shaped member, and a second wall portion positioned on the other surface of the first plate-shaped member in the opposite direction to the first wall portion along the outer edge of the first plate-shaped member,
one side housing of the pair of side housings includes a second plate-shaped member formed in the same planar shape as a planar shape of a corresponding one of the first housing and the second housing, and a third wall portion that is positioned on a surface of the second plate-shaped member that faces the middle housing along an outer edge of the second plate-shaped member,
the other side housing of the pair of side housings includes a third plate-shaped member formed in the same planar shape as a planar shape of a corresponding one of the first housing and the second housing, and a fourth wall portion that is positioned on a surface of the third plate-shaped member that faces the middle housing along an outer edge of the third plate-shaped member,
the first housing and the second housing are constructed so that in a state where the third wall portion and the first wall portion have been joined and the fourth wall portion and the second wall portion have been joined, the pair of side housings are disposed on both sides of the middle housing so as to sandwich the middle housing and gaps are respectively formed between the middle housing and the pair of side housings,
the injection coil and the detection coil are disposed in the respective gaps of the housing, stacked in a thickness direction of the injection coil and the detection coil, and
the housing is composed of an insulating resin material.

2. The resistance measuring apparatus according to claim 1, wherein the voltage injector includes a class D amplifier that amplifies the signal that is synchronized to the reference signal to generate the AC voltage.

* * * * *